United States Patent
Kochergin et al.

(10) Patent No.: US 7,135,120 B2
(45) Date of Patent: *Nov. 14, 2006

(54) METHOD OF MANUFACTURING A SPECTRAL FILTER FOR GREEN AND SHORTER WAVELENGTHS

(75) Inventors: Vladimir Kochergin, Westerville, OH (US); Philip Swinehart, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 238 days.

This patent is subject to a terminal disclaimer.

(21) Appl. No.: 10/453,938

(22) Filed: Jun. 4, 2003

(65) Prior Publication Data

US 2004/0045932 A1 Mar. 11, 2004

Related U.S. Application Data

(60) Provisional application No. 60/384,850, filed on Jun. 4, 2002.

(51) Int. Cl.
  B29D 11/00 (2006.01)
  B31D 3/00 (2006.01)
(52) U.S. Cl. .............................. 216/24; 216/2; 216/39; 216/56; 216/67; 216/79; 216/99; 205/656
(58) Field of Classification Search .................... 216/2, 216/24, 39, 56, 67, 79, 99; 205/656
See application file for complete search history.

(56) References Cited

U.S. PATENT DOCUMENTS

| | | | |
|---|---|---|---|
| 4,874,484 A | 10/1989 | Foell et al. | |
| 5,262,021 A | 11/1993 | Lehmann et al. | |
| 5,348,627 A | 9/1994 | Propst et al. | |
| 5,431,766 A | 7/1995 | Propst et al. | |
| 5,544,772 A | 8/1996 | Soave et al. | |
| 5,645,684 A | 7/1997 | Keller | |
| 5,987,208 A | 11/1999 | Gruning et al. | |
| 5,997,713 A | 12/1999 | Beetz, Jr. et al. | |
| 6,014,251 A | 1/2000 | Rosenberg et al. | |
| 6,168,906 B1 | 1/2001 | Bernstein et al. | |
| 6,380,099 B1 * | 4/2002 | Sakaguchi et al. | 438/747 |
| 6,521,149 B1 | 2/2003 | Mearini et al. | |

(Continued)

FOREIGN PATENT DOCUMENTS

DE 42 02 454 C1 11/1993

(Continued)

OTHER PUBLICATIONS

H. Ruda et al., "Mercury Pressure-Induced LPE Growth of HgCdTe," J. Electrochem. Soc., 130, p. 228-230 (1983).

(Continued)

Primary Examiner—Shamim Ahmed
(74) Attorney, Agent, or Firm—Nixon & Vanderhye P.C.

(57) ABSTRACT

The UV, deep UV and/or far UV (ultraviolet) filter transmission spectrum of an MPSi spectral filter is optimized by introducing at least one layer of substantially transparent dielectric material on the pore walls. Such a layer will modify strongly the spectral dependences of the leaky waveguide loss coefficients through constructive and/or destructive interference of the leaky waveguide mode inside the layer. Increased blocking of unwanted wavelengths is obtained by applying a metal layer to one or both of the principal surfaces of the filter normal to the pore directions. The resulting filters are stable, do not degrade over time and exposure to UV irradiation, and offer superior transmittance for use as bandpass filters. Such filters are useful for a wide variety of applications including but not limited to spectroscopy and biomedical analysis systems.

41 Claims, 20 Drawing Sheets

U.S. PATENT DOCUMENTS

| | | |
|---|---|---|
| 6,526,191 B1 | 2/2003 | Geusic et al. |
| 6,614,575 B1* | 9/2003 | Gruning et al. ............ 359/248 |
| 2002/0036299 A1* | 3/2002 | Young et al. ............... 257/184 |
| 2004/0004779 A1* | 1/2004 | Kochergin et al. .......... 359/885 |
| 2005/0199510 A1* | 9/2005 | Kochergin et al. .......... 205/640 |

FOREIGN PATENT DOCUMENTS

| | | |
|---|---|---|
| EP | 0 296 348 | 10/1989 |

OTHER PUBLICATIONS

P. H. Berning and A. F. Turner, "Induced transmission in absorbing films applied to band pass filter design," 47 Journal of the Optical Society of America 230, 1957).

Fritz Keilmann, "Infrared High-Pass Filter with High Contrast," Int. J. of Infrared and Millimeter Waves 2, 259-272 (1981).

T. Timusk and P. L. Richards, "Near millimeter wave bandpass filters," Appl. Optics 20, Issue 8, 1355 (Apr. 1981).

P. G. Huggard, M. Meyringer, A. Schilz, K. Goller, and W. Prettl, "Far-Infrared Band pass-Filters from Performated Metal Screens," Appl. Optics 33, 39 (1994).

Lehmann et al., "Optical shortpass filters based on macroporous silicon," Appl. Phys. Lett. V 78, N.5, Jan. 2001.

A. Birner et al., "Silicon-Based Photonic Crystals," Adv. Mater. 2001, 13 No. 6, Mar. 2001.

M. Christophersen et al., "Crystal orientation and electrolyte dependence for macropore nucleation and stable growth on p-type Si," *Materials Science and Engineering* B69-70 (2000) 194-198, May 2000.

J. Schilling et al., "Three-dimensional photonic crystals based on Macroporous silicon with modulated pore diameter", *Appl. Phys. Lett.* V 78, N.9, Feb. 2001.

S. Izuo et al., "A novel electrochemical etching technique for n-type silicon," *Sensors and Actuators* A 97-98 (2002), pp. 720-724.

A. Vyatkin et al., "Random and Ordered Macropore Formation in p-Type Silicon," *J. of the Electrochem. Soc.*, 149 (1), pp. G70-G76 (2002).

K. Barla et al., *J. Cryst. Growth*, 68, p. 721 (1984).

H. Föll et. al, "Formation and application of porous silicon", *Mat. Sci. Eng.* R 39 (2002), pp. 93-141 "Formation and application of porous silicon".

D.J. Lockwood et al., "Optical properties of porous GaAs," *Physica E*, 4, p. 102 (1999).

S. Langa et al., "Observation of crossing pores in anodically etched n-GaAs," *Appl. Phys. Lett.* 78(8), pp. 1074-1076, (2001).

B.H. Erne et al., *Adv. Mater.*, 7, p. 739 (1995).

P.A. Kohl et al., "The Photoelectrochemical Oxidation of (100), (111), and (111)n-InP and n-GaAs," *J. Electrochem. Soc.*, 130, p. 2288-2293 (1983).

Schmuki P et al., *Physica Status Solidi A*, "Pore Formation on n-InP," 182 (1), pp. 51-61, (2000).

S. Langa et al., "Formation of Porous Layers with Different Morphologies during Anodic Etching of n-InP," *J Electrochem. Soc. Lett.*, 3 (11), p. 514-516, (2000).

J.v.d. Lagemaat, Utrecht, Thesis (1998).

S. Langa et al., *Phys. Stat. Sol.* (A), 195 (3), "Electrochemical pore etching in Ge," R4-R6 (2003).

H. Föll et al., "Porous III-V compound semiconductors: formation, properties, and comparison to silicon", *Phys. Stat. Sol. A*, 197 (1), pp. 61-70 (2003).

M. Christophersen et al., "A comparison of pores in silicon and pores in III-V compound mateials", *Phys. Stat. Sol. A*, 197 (1), pp. 197-203, (2003).

H. Föll et al., "Pores in III-V Semiconductors", *Adv. Materials, Review*, 2003, 15, pp. 183-198, (2003).

S. Langa et al., *Phys. Stat. Sol. A*, 197 (1), p. 77, (2003) "Single crystalline 2D porous arrays obtained by self organization in n-InP" (pp. 77-82).

R.C. Furneaux et al., "The formation of controlled-porosity membranes from anodically oxidized aluminium," *Nature*, 337, p. 147 (Jan. 1989).

Schmuki, P. et al., *Physica Status Solidi A*, "Formation of porous layers on InSb(100) by anodization," 197, No. 1, pp. 71-76 (2003).

* cited by examiner

METHOD OF MANUFACTURING A SPECTRAL FILTER FOR GREEN AND SHORTER WAVELENGTHS

CROSS-REFERENCES TO RELATED APPLICATIONS

This application claims the benefit of priority from provisional application No. 60/384,850 filed Jun. 4, 2002, incorporated herein by reference. This application is related to commonly-assigned copending application Ser. No. 10/453,937, of Kochergin filed Jun. 4, 2003 entitled "Spectral Filter For Green and Shorter Wavelengths" also incorporated herein by reference.

STATEMENT REGARDING FEDERALLY SPONSORED RESEARCH OR DEVELOPMENT

Not applicable.

FIELD

The technology herein relates to optical filters and to methods of fabricating optical filters, and more specifically to ways to make optical filters constructed of artificially structured materials. Still more particularly, the technology herein relates to violet, ultraviolet, deep ultraviolet and far ultraviolet optical filters having significantly improved optical performance, manufacturability, extended physical longevity, transmitted wavelength stability, minimal autofluorescence and cost and to methods of manufacturing same.

BACKGROUND AND SUMMARY

Generally, optical filters and coatings are passive components whose basic function is to define or improve the performance of optical systems. There are many types of optical filters and they are used for a broad range of different applications. One common type of optical filter is a sunglass lens. Polarized sunglass lenses filter out light with a certain direction of polarization in addition to reducing the sun's intensity. Applications of optical filters and coatings can be diverse as in anti-glare computer screens, colored glass, sighting devices, and electrical spark imagers—to name just a few.

Some optical filters are specialized for different wavelength ranges of light. For example, many applications and instruments require optical filters that can be used to tune the optical behavior of light in the ultraviolet, deep ultraviolet or far ultraviolet wavelength range (i.e., at frequencies of radiant energy that are generally above the frequencies of visible light). Some example applications for such filters include deep-UV focal-plane arrays for military applications, electrical spark imaging, water purification, blood chemistry analysis, and the chemical evaluation of foods, pollutants, gases, and many other applications.

Much work has been done in the past to develop useful optical filters and coatings for ultraviolet and shorter wavelengths. As the wavelength of light becomes shorter in the ultraviolet range, however, certain prior art optical filter and/or coating construction suffers from disadvantages such as for example:
- poor optical performance,
- limited physical longevity,
- high autofluorescence,
- poor imaging quality of transmitted radiation, and/or
- transmitted wavelength instability.

The following discussion of the prior art is not intended to be limiting or to constitute any disclaimer. The PTO is encouraged to review the underlying references independently for possible relevance.

As one example, dielectric film technologies for optical coatings employed for ultraviolet applications generally include deposition of soft, marginally adherent multilayer thin films onto various glasses. Such films are generally soft and lack physical durability. Also, most such films are water-soluble. These films may consist, for example, of materials such as lead fluoride, cryolite ($AlF_6Na_3$), and zinc sulfide. Some such coatings also may contain refractory metal oxides that are in general more durable, but standard oxide coatings are generally optically unstable when exposed to a varying environment (e.g., temperature and humidity).

One way to protect these sensitive multilayer optical coatings is to embed them into a transparent epoxy by lamination onto other glass substrates. However, optical filters made by a soft or hard film deposition may include multiple coating layers and laminations, requiring cumbersome and relatively costly manufacturing processes. Moreover, the epoxy laminate can sometimes effectively limit the useful temperature range of the product, typically to less than about 100° C. Epoxies can also discolor and degrade over a short time period when exposed to ultraviolet radiation, rapidly degrading the filters' optical performance. Additionally, epoxy laminates may tend to autofluoresce upon exposure to UV radiation. These effects can limit the use of such laminates in sensitive, critical instrumentation and other sensitive applications requiring long-term and/or high stability and high temperature range.

Soft film filters can be vulnerable to abrasion and can be sensitive to temperature and humidity and therefore may have relatively limited operating lifetimes. Additionally, any laminates will generally degrade the ability to image through a filter of this type, significantly limiting their application.

Another type of ultraviolet optical filter employs thin films that are designated as "MDM" (Metal-Dielectric-Metal). MDM filters generally comprise essentially a single substrate of fused silica or quartz, upon which a multilayer coating consisting of two materials (e.g., a dielectric such as cryolite and a metal such as aluminum) is deposited. These MDM filters can work well in certain applications. However, MDM films are often soft and easily damaged by moisture and oxygen. To protect MDM filters from such damaging effects, it is often necessary to construct the final filter using a second, fused silica substrate mechanically fixed within a ring assembly with a vacuum or an atmosphere of a dry, inert gas separating the two substrates. This construction is expensive and heavy.

In typical applications, the MDM ultraviolet optical filter is generally operated as a bandpass filter, which will pass a short range of wavelengths and eliminate out-of-band wavelengths by reflection. For example, this type of filter is commonly employed for Deep UV applications (wavelengths shorter than 300 nm). The property of "induced transmission" generally governs the optical behavior of the coating. In at least some such filters, the thin metal film is induced to transmit energy at a particular design wavelength. MDM filters offer the advantage over soft-coating type filters of eliminating laminating epoxies, thus eliminating performance degradation due to solarization (UV discoloration). However, the optical performance of MDM filters is often rather limited. Typically, the peak transmission rate of 270 nm to 300 nm bandpass filters is at most about 10–25%.

The maximum usable temperature of this filter type can also be relatively low, typically less than 150° C.

Yet another type of ultraviolet optical filter employs uniform arrays of metallic waveguides, such as disclosed for example in U.S. Pat. No. 6,014,251 issued to A. Rosenberg et al. Jan. 11, 2000. At 100 µm and longer wavelengths, filters based on arrays of metallic waveguides have been well known in the art for a considerable time ([Fritz Keilmann, *Int. J. of Infrared and Millimeter Waves* 2, p. 259. (1981)], [T. Timusk and P. L. Richards, *Appl. Optics* 20, p.1355 (1981)], [P. G. Huggard, M. Meyringer, A. Schilz, K. Goller, and W. Prettl, "Far-Infrared Band pass-Filters from Perforated Metal Screens", *Appl. Optics* 33, p. 39 (1994)]). Such filters generally demonstrated advantageous properties. For example, they are relatively rugged (they generally consisted of a single piece of perforated metal); relatively lightweight, compact, and relatively insensitive to environmental factors such as heat and humidity. In addition to ruggedness, far-infrared filters based on arrays of metal waveguides have shown additional advantages over other types of filters. For example, the cutoff wavelength is generally insensitive to the propagation direction of the incident radiation, while the transmission efficiency generally decreases only gradually as the propagation direction deviates from the normal to the plane of the leaky waveguide array.

Unfortunately, techniques used for the manufacture of such metallic waveguide-based IR optical filters generally cannot be extended easily into the near-infrared, visible, and UV spectral regions. In order to have cutoff wavelengths in these spectral regions, holes with diameters between 10 and 0.1 µm and an aspect ratio $(t/d) \gg 1$ (where t is the thickness of the perforated material and d is the diameter of the holes) are generally required. This can be difficult to accomplish as a practical matter in machined metal. One known technique to make such optical filters is based on the same general principles adopted for UV, visible and near-infrared wavelength ranges. It is possible to use nanochannel glass and to follow up initial fabrication processes by covering channel walls and both surfaces of the filter with highly reflective material such as metal, as disclosed in U.S. Pat. No. 6,014,251 issued to A. Rosenberg et al. Jan. 11, 2000. However, this fabrication process may result in a general lack of control of the shape of the transmission spectrum. In particular, the transition from full transmission to full blocking of such filters in the UV range can take up to more than a hundred nm in wavelength, which is not acceptable for many practical applications. A sharper transmission edge can be achieved by increasing of the aspect ratio, but this may result in strong degradation of overall transmission efficiency. Another drawback of the glass microchannel approach includes the lack of control over the uniformity of channel sizes, leading to even wider transmission edges (resulting in degradation of the transmitted image quality) and channel wall smoothness (resulting in even stronger losses within the pass-band).

Another type of ultraviolet optical filter was recently disclosed in [Lehmann et al., *Appl. Phys. Lett.* V 78, N.5, January 2001]. This filter configuration is based on the spectral filtering of light in an array of leaky waveguides in the form of pores in Macroporous Silicon ("MPSi"). An advantage of this approach is generally better manufacturability and better control over uniformity of the hollow channels comprising the array and over the channel wall smoothness. One such illustrative method of optical filter manufacturing consists of forming a freestanding macropore array from N-doped Si wafer in fluoride-containing electrolyte under certain backside illumination conditions. Precise control over the pore distribution across the surface of the wafer may be possible if preliminary patterning of the silicon wafer surface with regularly distributed depressions (so-called "etch pits") is performed. Pore diameters can be kept in a more narrow size range than when using the microchannel glass technology. The pore walls are also considerably smoother. Due to absence of any fluorescence from silicon, such filters should have no autofluorescence at all. Due to the excellent mechanical properties of silicon, such filters are robust under very high temperatures (up to 1100° C).

Information about manufacturing such filters can be found in U.S. Pat. No. 5,262,021 issued to V. Lehmann et al. Nov. 16, 1993 (which claims priority to Fed. Rep. Of Germany Patent #4202454, issued Jan. 29, 1992), in which a method of forming of free-standing macropore arrays from an n-doped Si wafer is disclosed. Lehmann also describes the use of such arrays as optical filters. However, the method of removing the macroporous layer from the Si wafer, as disclosed in U.S. Pat. No. 5,262,021, will result in the second surface of the macroporous layer being inherently rough, causing high losses due to scattering. In these disclosures, the MPSi layer is used without any further modifications. While such filters exhibit some short-pass filtering, the transmission spectral shape through them will be unusable for commercial applications due to the wide blocking edge.

Macroporous silicon layers with modulated pore diameters throughout the pore depth is disclosed in, for example, [U.S. Pat. No. 5,987,208 issued to U. Gruning and V. Lehmann et al. Nov. 16, 1999] or [J. Schilling et al., *Appl. Phys. Lett.* V 78, N.9, February 2001]. However, in such disclosures, the MPSi layer is not freestanding, i.e. a substantial portion of the silicon wafer is left under the porous layer, thus making such a structure completely opaque and non-functional in the UV and visible spectral ranges.

By way of example, FIG. 1 is a diagrammatic perspective view of an exemplary prior art freestanding MPSi uniform pore array section of a uniform cubic lattice such as disclosed in Lehmann (U.S. Pat. No. 5,262,021 issued to V. Lehmann, et al Nov. 16, 1993; and Lehmann et al., *Appl. Phys. Lett.* V 78, N.5, January 2001). The exemplary FIG. 1 prior art spectral filter consists of air- or vacuum-filled macropores 1.2 disposed into the silicon wafer host 1.1. The macropores 1.2 are disposed such that an ordered uniform macropore array is formed, where the ordering is a key attribute. The pore ends are open at both first and second surfaces of the silicon wafer 1.1. Since silicon is opaque in the deep UV, UV, visible and part of the near IR wavelength ranges, light can pass through the structure shown in FIG. 1 only through the pores. As shown in FIG. 2, the silicon absorption coefficient k is very high at wavelengths below~400 nm and moderately high at wavelengths below~900 nm, which blocks all radiation coming through the silicon having a thickness of 50 micrometers or more.

Since pore diameters of 100 nm–to 5000 nm are comparable with the wavelength of light (200 nm–1000 nm) and due to the high aspect ratios possible in MPSi structures $((t/d)>30)$, the transmission through such a macroporous structure at wavelengths below about 700 nm takes place through leaky waveguide modes. In such leaky waveguide modes, the cores of the leaky waveguides are air or vacuum-filled, while the reflective walls of the leaky waveguides the pore walls. This can be seen in FIG. 2 by the near-metallic behavior of the refractive index n and absorption coefficient k of silicon at wavelengths below ~370 nm. Hence, MPSi material can be considered as an ordered array of leaky waveguides. By means of the high absorption of the walls, each leaky waveguide pore can be considered to be independent of the others in the visible, UV and deep UV spectral ranges if they are separated by silicon walls with thicknesses >20–100 nm.

In the near IR and IR wavelength ranges, the nature of the transmission through the filter of FIG. 1 changes. This happens because silicon becomes less opaque at 700–900 nm and becomes transparent at wavelengths starting approximately from 1100 nm. Light at these wavelengths can pass through the MPSi structure of FIG. 1 not only through the pores, but also through the silicon host. Due to the porous nature of the silicon host, the transmission occurs through waveguide modes confined in the silicon host. As a high refractive index material, silicon can support waveguide modes if surrounded by a lower refractive index material (air or vacuum). Since close packing of the pores is essential for efficient transmission through the filter of FIG. 1, such a structure can be considered to some approximation in the near IR as an array of Si waveguides in an air host. When the wavelength of light becomes much larger than the pore array pitch, the light starts interacting with the MPSi layer as if it were a single layer of uniform material having its dielectric constants averaged through the pores and the host. As an illustration, for a square array of pores with 4 micrometer pitch, transmission takes place starting approximately at a wavelength of 20 micrometers.

In the leaky waveguide regime applicable to the UV through extreme UV spectral region, the optical loss coefficient, $\alpha$, having dimensions cm$^{-1}$, will be used to characterize the optical transmission. The amount of light still remaining in the pore leaky waveguide (or Si host waveguide) after it travels a length l is proportional to $\exp(-\alpha(\lambda)l)$, and the light remaining in the MPSi array at the distance l from the first MPSi layer interface is equal to $I_0 P(\lambda) \exp(-\alpha(\lambda)l)$, where $I_0$ is the initial intensity of the light entering the pore and $P(\lambda)$ is the coupling efficiency at the first MPSi interface. The optical loss coefficient is, in turn, a function of pore size, geometry, distribution, and wavelength. It is also depends on the smoothness of the pore walls. The roughness of the walls introduces another source of absorption of light, i.e., scattering, which is proportional to the roughness to wavelength ratio.

An illustrative, numerically calculated spectral dependence of loss coefficients for the prior art MPSi filter of FIG. 1 is shown in FIG. 3a. In this non-limiting illustrative example, the pore array is made up of 1×1-micrometer vacuum-filled pores. It follows from this illustrative plot that for the chosen pore array dimensions, transmission through pore leaky waveguides is dominant up to about 700 nm and the transmission through the silicon host waveguides is dominant starting from about 800 nm. At 700–800 nm, both transmission mechanisms compete with each other. The increase of the losses through leaky waveguides with increasing wavelength is due to both the reduction of the reflection coefficient of silicon and to the redistribution of the leaky waveguide mode over the pore cross-sections. The modal field penetration into the silicon host material, as well as the optical losses, increase with the wavelength.

Referring now to FIGS. 3b and 3c, illustrative plots of the numerically calculated dependences on pore size of the effective refractive indices and loss coefficients are shown. Transverse electric (TE-polarized) leaky waveguide modes are shown for the structure of FIG. 1. The wavelength for this particular example is 250 nm. Losses of each of the modes decrease with the increase of the pore size due to the mode intensity redistribution inside the pore described above. It follows from FIGS. 3b and 3c that pores become multimode leaky waveguides starting approximately with a pore diameter of 220 nm. For example, for a pore with a 1 micrometer cross-section, the number of TE-polarized modes is expected to be 8. This means that the transmission through the MPSi filter takes place not through one leaky waveguide mode, but rather through a number of leaky waveguide modes. The amount of light remaining at the distance l into the pore from the first MPSi filter surface can be estimated as $I_0 \Sigma P_{i,j}(\lambda) \exp(-\alpha_{i,j}(\lambda)l)$ where the i,j are the mode order indices. These are introduced as follows: i=j=0 corresponds to the fundamental mode and so on; $P_{i,j}(\lambda)$ is the coupling efficiency into i,j-th mode and $\alpha_{i,j}(\lambda)$ is the loss coefficient of i,j-th mode. The summation should be done through all the modes supported by the given pore structure.

It follows from FIG. 3c that losses increase very quickly with the increase of mode order (note that the losses in FIG. 3c are presented on a logarithmic scale). Moreover, the coupling coefficient $P_{i,j}(\lambda)$ is vanishingly small for square pores and near-normal incidence conditions for either i or j odd. This means that in general only the first one or two modes are responsible for the transmission through an MPSi structure of reasonable thickness (>20 micrometers) for pore diameters up to 1.5 microns. As a practical matter, all light coupled into higher order modes will be absorbed while traveling through a porous leaky waveguide. Coupling efficiency, in turn, is the highest for the fundamental mode and quickly decreases with the increasing mode order.

There are other parameters affecting prior art MPSi filter performance. These include the coupling efficiency of incident light into leaky waveguide modes at the first MPSi wafer interface and the out coupling from the leaky waveguide modes to transmitted light at the second MPSi wafer interface. If a plane-parallel beam of light is incident on the MPSi interface, the coupling efficiency to the leaky waveguide fundamental mode can be roughly estimated as:

$$P(\lambda) \approx \frac{S}{S_{uc}},$$

where S is the area of pores 1.2 in FIG. 1, while $S_{uc}$ is the area of a MPSi array unit cell (which can be introduced for ordered MPSi arrays only). In other words, to a good approximation, $P(\lambda) \sim p$ in the UV spectral range, where p is the porosity of an MPSi filter near the first MPSi wafer interface.

At the second interface of the exemplary MPSi filter, the light from waveguide ends (leaky or not, as applicable) is emitted with a divergence governed by the numerical aperture, NA, and wavelength. In the far field, the destructive and constructive interference of all light sources in the form of leaky waveguide or waveguide ends takes place. In the case of an ordered MPSi array, this leads to a number of diffraction orders, which are defined by the pore array geometry (i.e. by the relationship between pore size, pore-to-pore distance) and the wavelength of the light. For most applications of optical filters, only light outcoupled into the $0^{th}$-diffraction order is of interest. However, some applications are not sensitive to the outcoupling of light to higher diffraction orders, for instance, when the filter is directly mounted on the top of a photodetector or a detector array. In other cases, the main source of outcoupling losses is the redistribution of light into higher diffraction orders. Such losses are sensitive on both wavelength and pore array geometry. They are more pronounced at short wavelengths due to the higher number of diffraction orders.

It should be noted that outcoupling losses can be completely suppressed for any given wavelength if the MPSi array period is less than or equal to that wavelength. For instance, for a 280 nm wavelength in the "solar-blind" region of spectrum that is important for many applications, this will generally require a pore array period on the order of 280 nm or less and pore diameters of about 100-200 nm.

The exemplary prior art spectral filter structure of FIG. 1 is disadvantageous from the viewpoint of the wide transition from the pass band of the spectral filter to the blocking band, referred to herein as "blocking edge". For example, it is often desirable to make the blocking edge as narrow as it possible, while keeping the transmission within the pass band as high as possible. Modifications of pore diameter d and MPSi thickness t of the prior art structure of FIG. 1 cannot solve this problem, since increasing t while keeping d constant or decreasing d while keeping t constant leads to some narrowing of the transmission edge, but this is accomplished at the expense of strong degradation of filter transmission efficiency and an unavoidable shift of the blocking edge to shorter wavelengths, which is clearly unacceptable.

There are also several disclosures related to the method of manufacturing of macroporous structures with controlled positions of the pores. An early disclosure is U.S. Pat. No. 4,874,484 issued to H. Foell and V. Lehmann issued Oct. 17, 1989 (which claims priority to Fed. Rep. Of Germany Patent #3717851 dated May 27, 1987). This patent describes a method of generating MPSi arrays from n-doped (100)-oriented silicon wafers in HF-based aqueous electrolytes (i.e. based on HF diluted with water) under the presence of backside illumination. It also describes a method of controlling the position of macropores through formation of etch-pits. Etch pits are typically, but not exclusively, pyramid-shaped openings formed on the silicon or other semiconductor surface that can be formed through mask openings upon exposure to anisotropic chemical etchants. In addition, the use of wetting agents (such as formaldehyde) and controlling the pore profile through chronologically-varying applied electrical potential also was disclosed. However, the pores in these MPSi arrays were not open from both ends.

A freestanding macropore structure was disclosed U.S. Pat. No. 5,262,021 issued to V. Lehmann and H. Reisinger. The method of forming MPSi layer from an n-doped, (100) oriented silicon wafer in an HF-based aqueous electrolyte under the presence of back-side illumination was disclosed. In addition, the use of an oxidation agent and several methods of stripping the MPSi layer from the unetched part of the silicon wafer was described. Although stripped MPSi layers according to the disclosed method can be used as functional short-pass filters (with the drawbacks, disclosed previously), the optical quality of the second surface of the MPSi layer is quite poor (due to inherent roughness) and thus this prior art method is disadvantageous in some aspects.

A method of MPSi layer formation in non-aqueous electrolytes is disclosed in U.S. Pat. No. 5,348,627 issued Sep. 20, 1994 and U.S. Pat. No. 5,431,766 issued Jul. 11, 1995, both to E. K. Propst and P. A. Kohl. Organic solvent-based electrolytes are used for forming porous layers in n-doped silicon under the presence of the front-side illumination. Example solvent based electrolytes are acetonitrile (MeCN), diemethyl formamide (DMF), propylene carbonate ($C_3O_3H_6$) or methylene chloride ($CH_2Cl_2$)) containing organic supporting electrolytes, such as tetrabutilammonium perchlorate ($C_{16}H_{36}NClO_4$) and tetramethylammonium perchlorate ($C_4H_{12}NClO_4$) and anhydrous sources of fluoride, for example, HF, fluoroborate ($BF_4^-$), tetrabutylammonium tetrafluoroborate (TBAFB), aluminum hexafluorate ($AlF_6^{3-}$) and hydrogen difluoride ($HF_2^-$). However, the MPSi layer quality obtained by using this method is of generally poor optical quality with strong pore wall erosion and branching.

A method of manufacturing ordered free-standing MPSi arrays with pore walls coated by a semiconducting layer with follow-on oxidizing or nitriding through a CVD process was disclosed in U.S. Pat. No. 5,544,772 issued Aug. 13, 1996 to R. J. Soave et. al in relation to production of microchannel plate electron multipliers. N-doped silicon wafers, photoelectrochemically etched in HF-based aqueous electrolyte, were disclosed. Constraint of the substrate during the oxidation process has been also taught.

Another method of manufacturing MPSi-based microchannel plate electron multipliers is disclosed in U.S. Pat. No. 5,997,713 issued Dec. 7, 1999 to C. P. Beetz et al. This patent describes an ordered, freestanding MPSi array through electrochemical etching of a p-doped silicon wafer. Both aqueous and non-aqueous (acetonitrile, tetrabuthylsulfoxide, propylene carbonate or metholene chloride-based) electrolytes based on both HF and fluoride salts were disclosed for MPSi layer manufacturing. Covering pore walls of freestanding MPSi array with a dynode and insulating materials through CVD, sol-gel coating, electrolytic deposition, electrodeposition and electroless plating was disclosed. Use of mechanical grinding, polishing, plasma etching or chemical back-thinning to remove the remaining part of the silicon wafer in line with the pores were disclosed. The use of surfactant to improve pore quality was also taught.

Certain of these various structures described above are not intended to be functional as spectral filters. Any spectral filtering properties these structures exhibit over some wavelengths would appear to be by accident rather than by design The use of a conductivity-promoting agent in organic-based electrolytes (DMF) during the photoelectrochemical etching of n-doped silicon was disclosed in S. Izuo et al., *Sensors and Actuators* A 97–98 (2002), pp. 720–724. The use of isopropanol (($CH_3)_2CHOH$) as a basis for an organic electrolyte for electrochemical etching of p-doped silicon was disclosed in, for example, A. Vyatkin et al., *J. of the Electrochem. Soc.,* 149 (1), 2002, pp. G70–G76. The use of ethanol ($C_2H_5OH$) to reduce hydrogen bubble formation during electrochemical etching of silicon as an addition to aqueous HF-based electrolytes was disclosed in, for example, K. Barla et al., *J. Cryst. Growth,* 68, p. 721 (1984). Completely filling the pores with silicon dioxide or doped silicon dioxide through CVD, particularly to create optical waveguides (similar to optical fibers in structure) for integrated circuit interconnects was disclosed in U.S. Pat. No. 6,526,191 B1 issued Feb. 25, 2003 to Geusic et al. A detailed review of the various aspects of MPSi formation can be found in H. Foell et. al, *Mat. Sci. Eng.* R 39 (2002), pp. 93–141.

In addition to silicon, macropores have been obtained in other types of semiconductor and ceramic materials. Macropores obtained in n-type GaAs by electrochemical etching in acidic electrolytes (aqueous HCl-based) were reported by, for example, D. J. Lockwood et al., *Physica E,* 4, p. 102 (1999) and S. Langa et al., *Appl. Phys. Lett.* 78(8), pp.1074–1076, (2001). Macropores obtained in n-type GaP by electrochemical etching were reported by B. H. Erne et al., *Adv. Mater.,* 7, p. 739 (1995). Macropore formation during electrochemical etching (in aqueous and organic solutions of HCl and mixtures of HCl and $H_2SO_4$) of n-type InP was reported by P. A. Kohl et al., *J. Electrochem. Soc.*, 130, p. 228 (1983) and more recently by Schmuki P et al., *Physica Status Solidi A,* 182 (1), pp. 51–61, (2000); S. Langa et al., *J. Electrochem. Soc. Lett.,* 3 (11), p. 514, (2000). Macroporous GaN formation during electrochemical etching was reported by J. v. d. Lagemaat, Utrecht (1998). Macropore formation during electrochemical etching of Ge was reported by S. Langa et al., *Phys. Stat. Sol.* (A), 195 (3), R4–R6 (2003). Reviews of macropore formation in III–V semiconductors can be found in H. Foell et al., *Phys. Stat. Sol. A,* 197 (1), p. 64, (2003); M. Christophersen et al., *Phys. Stat. Sol. A,* 197 (1), p. 197, (2003), and H. Föll et al., *Adv. Materials, Review,* 2003, 15, pp.183–198, (2003).

It may be that no spectral filter technology has yet been demonstrated in any porous semiconductor material other than silicon. For example, freestanding macroporous semiconductor layers, which are useful for ultraviolet filter, have not been demonstrated in materials other than silicon. Ordered pore arrays were reported for n-doped InP (S. Langa et al., *Phys. Stat. Sol. A,* 197 (1), p. 77, (2003)), but in that context the order which was obtained was due to self-organization rather than due to pore formation in predetermined locations. No post-growth coating of the pore walls was disclosed.

Another macropore material widely known to those skilled in the art is anodic alumina that is obtained by electrochemical etching of an aluminum layer in an acidic electrolyte (see, for example, R. C. Furneaux et al., *Nature,* 337, p. 147 (1989), and others). Such layers are usually made freestanding and consist of high aspect ratio cylindrical pores that can be made random, self-ordered into pore polycrystallites or ordered through preliminary preparation of the pore nucleation sites similar to the etch pits previously discussed for silicon. Despite of the fact that pore filling in anodic alumina by metals or semiconductors has been widely employed, the coating of pore walls for use as optical filters has not been attempted or taught.

In addition to electrochemical etching, other methods of producing pore-like structures are known to those skilled in the art. As an example, deep Reactive Ion Etching (DRIE) has been used to produce relatively high aspect ratio hole structures with CVD-deposited diamond coated walls for microchannel plate electron multipliers (see, for example, U.S. Pat. No. 6,521,149 issued Feb. 18, 2003 to Mearini et al.). Such structures are also made freestanding by backside removal of the silicon through grinding, polishing or etching. Various methods of filling high vertical aspect ratio structures by various materials can be found in U.S. Pat. No. 5,645,684 issued Jul. 8, 1997 to C. G. Keller.

To overcome these and other problems, we provide in one non-limiting illustrative exemplary arrangement, an improved UV, deep UV or far UV (e.g., green or shorter wavelengths) filter configuration based on a substantially uniform array of leaky waveguides made of porous semiconductor (where pores are straight and non-branching). Further, the pore walls are covered by at least one layer of transparent material. Pore cross sections can be modulated at least along part of the depths while other parts are left unmodulated, or the entire depths can be modulated. Such spectral optical filters can be used for short-pass, band-pass, narrow-band pass or band blocking spectral filtering, and provide significant advantages. The advantages include, but are not limited to, omnidirectionality, i.e., absence of the spectral shape dependence of transmission (for transmission type optical filters) or reflection (for reflection type optical filters) on the angle of incidence within the acceptance angles of the filter. Other advantages are manufacturability (i.e., the ability to fabricate such filters relatively simply and inexpensively compared to the other filter configurations known by those skilled in the art), absence of autofluorescence and delamination problems.

The exemplary non-limiting configuration is based on the formation of a large number of identical, mutually decoupled, leaky waveguides arranged with respect to each other such that the transmission through the array is possible only through at least one of the leaky waveguide modes of the assembly of leaky waveguides. The mode loss spectrum of each of said leaky waveguides is wavelength dependent and can be tuned to the desired spectral shape and position by modifying the structure of said leaky waveguides. Said modifications include coherently (periodically with a single period) modulating the cross sections of the leaky waveguides along the depths of the leaky waveguides, covering the walls of the leaky waveguide with dielectric multilayer structures or combining these two methods. The transmission spectrum of such a spectral filter is determined by the mode loss spectrum of each leaky waveguide and by the coupling/outcoupling efficiencies at the first and second surfaces of such a spectral filter. In addition, one or both broad faces of the filter made up of pore leaky waveguides can be covered by absorptive and/or reflective material such as, for example, metal, semiconductor or high-reflectance dielectric multilayer coatings. These coatings, covering the broad faces of the non-pore material between the leaky waveguide ends, provide wider blocking ranges outside the desired spectral band of the filter. In the case of metal layers, the great advantage is obtained that the blocked spectrum extends without unwanted peaks or valleys to the long wavelength side of the desired spectrum without limit. Further, stronger blocking than obtained with any other type of filter is obtained over at least part of the blocking range.

The leaky waveguide array can be formed in a semiconductor wafer in the form of channels going through the wafer (pores). Such a structure can be fabricated, for example, by forming the layer of porous semiconductor by means of electrochemical etching of a single crystal semiconductor wafer as deeply as necessary and subsequently removing the un-etched remainder. By this procedure, a free-standing porous semiconductor layer is made with the pores extending completely through the semiconductor. Pores formed by such a process will serve as leaky waveguides at short wavelengths, while the semiconductor host, absorptive at wavelengths shorter than the band edge of the particular semiconductor material, will insure the absence of coupling between the leaky waveguides. The previously mentioned modulation of the cross sections of the leaky waveguides can be achieved through modulating the pore diameters along their depths by modulating the electrochemical etching parameters during electrochemical etching process. For example, the parameters available for modulation include the current density, illumination intensity or others known to those skilled in the art. Said semiconductor material can be silicon (P-type doped or N-type doped), gallium arsenide, indium phosphide, or any other material, shown to form straight pores during electrochemical etching in a suitable electrolyte and under suitable conditions. Alternatively, said wafer can be of aluminum and a porous layer can be grown by the anodic oxidation aluminum in a suitable electrolyte under the suitable conditions. The resulting aluminum oxide porous layer can be made freestanding with the pores extending from one surface of the substrate to the opposite surface by, for example, continuing of the electrochemical etching process until the pores are etched completely through substrate, by the chemical or electrochemical etching of the unwanted substrate material from the back side after the anodic etching pore formation step, by Reactive Ion Etching, mechanical or chemical-mechanical polishing or by any other process known to those skilled in the art. The covering of the walls of the leaky waveguides can be achieved by partial thermal oxidation of a semiconductor (principally silicon), or by depositing a dielectric single layer or multilayer onto the pore walls by Chemical Vapor Deposition or by any other deposition, sputtering, evaporation or growth process known to those skilled in the art. Covering the substrate or wafer surface (or surfaces) between the pores by an absorptive or reflective structure can be accomplished by directional deposition techniques, such as physical vapor deposition, magnetron sputtering, thermal or electron beam evaporation, ion assisted ion plating or any other technique known to those skilled in the art. Further, if the filter structure is too fragile for its intended use, the porous layer can be reinforced by sealing between two plates of a material that is transparent over the transparency wavelength range of the porous filter. Such plates can be, for instance, of glass, silica, UV enhanced silica, $CaF_2$ or any other transparent dielectric known to those skilled in the art.

Pores can be completely filled by a material transparent in the transparency wavelength range of the porous filter configuration to increase the acceptance angle of the filter. This may, however, limit the pass band of the filter to the transparency range of the pore filling material (for example to 150 nm for silicon dioxide or 200–300 nm for some polymers). Pore filling can be accomplished by chemical vapor deposition, injection molding, dye casting, capillary absorption of a liquid into the pores or by any other method known to those skilled in the art.

Said at least one optically transparent layer covering the pore (channel) walls may by designed to substantially minimize losses of the leaky waveguide modes supported by each of said pores within at least part of the designed pass-band of said spectral filter. Alternatively, said at least one optically transparent layer will substantially maximize losses of leaky waveguide modes supported by each of said pores at the predetermined wavelengths ranges within at least part of the blocking band of said spectral filter. Still, alternatively, said at least one optically transparent layer may be disposed to minimize the width of the blocking edge of spectral filter.

The pores can be disposed across the broad surfaces of the wafer or substrate with a predetermined pattern having predetermined symmetry (for example, cubic or hexagonal). Alternatively, said pores can be disposed randomly or made to have only short-range order in the planes of the broad surfaces of the wafer or substrate. The pores can as well be disposed at a predetermined pattern that does not possess any simple symmetry. Each of the types of pore patterns will produce different optical effects.

Additionally, the pores may have circular or near-square cross-sections. Alternatively, said pores can have substantially elongated cross-sections with one axis parallel to the substrate surface being substantially longer that the orthogonal axis. In the latter case, the mode losses for the wave having polarization such as the electrical vector of said electromagnetic wave is parallel to the major axis of the pore will be lower than the mode losses for the wave having a perpendicular orientation of the electric field vector (i.e., polarization), so a spectral filter of this invention in this aspect will be a polarizer. Since the transparency window of such a filter can be extended down to Far or Extreme UV, such a filter can be used as a polarizer for these wavelengths a capability not possible in the prior art.

The pores can be made to have tapered ends at the at least one (first or second) surface of said filter, or to taper uniformly or non-uniformly along their entire lengths. At the either narrow end of the taper the pore lateral cross-section is gradually increased again when approaching the near surface of the filter substrate in order to increase the coupling and/or outcoupling efficiency to improve the transmittance through the filter.

The resulting filters have the advantages of stability. They do not degrade over time and exposure to UV irradiation, and offer superior transmittance compared to prior art for use as bandpass filters. Such filters are useful for a wide variety of applications, including applications where currently available filter systems cannot provide acceptable performance. For instance, such optical filters will be significantly improved comparing to the prior art for a variety of analytical devices. In particular, in many biomedical analysis systems, for example in detecting the presence of a specific marker (e.g. enzyme) in a blood or tissue sample, the marker will be identified by fluorescence upon exposure of the sample to a detection wavelength. The emission from the sample can only be accurately detected using a filter such as disclosed herein that does not autofluoresce. In contrast, prior art filters may exhibit significant autofluorescence, such as resulting from the required epoxy lamination of such filters, and such autofluorescence can render the analysis system unreliable or even practically inoperable. Preferred exemplary non-limiting filters exhibit essentially no autofluorescence, e.g. autofluorescence at levels below that which may interfere with analytical use of the filter in biomedical or other applications.

This specification also discloses exemplary non-limiting illustrative methods for manufacturing spectral filters. According to one embodiment, spectral filters can be produced by:
  taking the semiconductor wafer having first and second surfaces wherein said first surface is substantially flat,
  producing a porous layer in said wafer starting from the first surface,
  coating the pore walls with at least one layer of transparent material, and
  subsequently removing the un-etched part of the wafer that remains under the porous layer.

The porous layer can be formed through electrochemical etching of said semiconductor wafer in acidic electrolyte. The etching method may include connecting the substrate as an electrode, contacting the first surface of the substrate with an electrolyte, setting a current density (or voltage) that will influence etching erosion, and continuing the etching to form said pores extending to a desired depth substantially perpendicularly to said first surface. Said semiconductor wafer can be, but is not limited to, a silicon wafer. Preliminary depressions can be formed on the first surface of said wafer (etch pits) to control the locations of the pores to be formed in the electrochemical etching process. Said etch pits can be formed through applying a photoresist layer on the first surface of the semiconductor wafer, photolithographically defying the pattern of openings and chemically or reactive ion etching the etch pits through said openings. Alternatively, said etch pits can be formed by depositing (through chemical or physical vapor deposition, thermal oxidation, epitaxial growth, sol-gel coating or any other technique known to those skilled in the art) a material layer with different chemical properties than that of the substrate, applying a photoresist layer on the top of said material, photolithographically defining the pattern of openings in the photoresist layer, transferring said patterns into said layer through chemical or reactive ion etching and transforming the resultant pattern into a corresponding etch pit pattern through chemical or reactive ion etching. Said layer of material with different chemical properties than that of the substrate wafer may then be removed through chemical etching, reactive ion etching or any other method known to those skilled in the art.

More specifically, said semiconductor wafer can be an n-doped, <100> orientated silicon wafer. The electrolyte can be in this case an HF-based aqueous acidic electrolyte. Alternatively, the electrolyte can be an HF-based organic electrolyte. Alternatively, said semiconductor wafer can be a p-doped, <100> orientated silicon wafer. The electrolyte in this case may be HF-based organic electrolyte. The electrolyte may contain hydrofluoric acid in a range of 1% to 50%, but preferably 2 to 10% by volume. A second surface of the substrate wafer that lies opposite the first surface may be illuminated during electrochemical etching. The electrolyte may additionally contain an oxidation agent, a hydrogen reducing agent (e.g., selected from the group of chemicals consisting of mono functional alkyl alcohols, tri functional alkyl alcohols), a viscosity increasing agent, a conductivity-modifying agent, and/or other organic additives. Electrochemical process parameters such as current density, applied voltage, and illumination intensity can be kept constant during the pore formation process. Alternatively, said electrochemical process parameters can vary in a predetermined fashion during the pore growth process to provide the pores with needed variations in cross sections. As a further alternative, said semiconductor wafer can be of material chosen from the full possible range of alloys and compounds of zinc, cadmium, mercury, silicon, germanium, tin, lead, aluminum, gallium, indium, bismuth, nitrogen, oxygen, phosphorus, arsenic, antimony, sulfur, selenium and tellurium. The electrolyte may be an acidic electrolyte with the acid suitably chosen for pore formation in the particular semiconductor material.

Alternatively, said porous layer can be produced by Reactive Ion Etching (more specifically by deep Reactive Ion Etching). A layer of material with different chemical properties than that of the semiconductor wafer may be deposited in this case on the first surface of semiconductor wafer and the openings (at the positions where pores should be disposed) may be formed in this layer through photolithography and etching (chemical or RIE) steps. The pores in the semiconductor wafer then may be formed through the mask formed in the chemically different masking layer during reactive ion etching process.

Said coating of the pore walls with at least one layer of transparent material can be done through Chemical Vapor Deposition (CVD), thermal oxidation, liquid immersion or any other method known to those skilled in the art. Removing of the un-etched part of the wafer can be performed through grinding, mechanical polishing, chemical-mechanical polishing, chemical etching, reactive ion etching or any other method known to those skilled in the art.

According to another non-limiting illustrative arrangement, the completed porous structure is sealed between two transparent plates. Further according to another aspect of the same arrangement, at least one of the first or second surfaces of the porous layer is coated by at least one layer of absorptive or reflective material.

According to a further illustrative non-limiting method of manufacturing a spectral filter, the filter can be produced by:

starting with a semiconductor wafer having first and second surfaces, wherein said first surface is substantially flat, producing a porous layer in said wafer starting from the first surface, removing the un-etched part of said wafer at the ends of the pores and coating the pore walls with at least one layer of transparent material.

The porous layer can be formed through electrochemical etching of said semiconductor wafer in acidic electrolyte. The etching step may include connecting the substrate as an electrode, contacting the first surface of the substrate with an electrolyte, setting a current density (or voltage) which will influence the etching erosion, and continuing the etching to form said pores extending to a desired depth substantially perpendicularly to said first surface. Said semiconductor wafer can be, but is not limited to, a silicon wafer. Preliminary depressions can be formed on the first surface of said wafer (etch pits) to control the locations of the pores to be formed in the electrochemical etching process. Said etch pits can be formed through applying a photoresist layer on the first surface of the semiconductor wafer, photolithographically defining a pattern of openings and chemically or reactive ion etching etch pits through said openings. Alternatively, said etch pits can be formed through depositing, by chemical or physical vapor deposition, thermal oxidation, epitaxial growth, sol-gel coating or any other technique known to those skilled in the art, a material layer with different chemical properties than that of the substrate, applying a photoresist layer on the top of said chemically different material, photolithographically defining a pattern of openings in the photoresist layer, transferring this patterns into said layer through chemical or reactive ion etching and subsequently transforming the resultant pattern into etch pits by chemical or reactive ion etching. Said layer of material with different chemical properties than that of the substrate wafer may then be removed through chemical etching, reactive ion etching or any other method known to those skilled in the art, or may remain on the first surface to perform a function in the spectral filter.

More specifically, said semiconductor wafer can be an n-doped, <100> oriented silicon wafer. The electrolyte can be in this case HF-based aqueous acidic electrolyte. Alternatively, the electrolyte can be HF-based organic electrolyte. Alternatively, said semiconductor wafer can be a p-doped <100> oriented silicon wafer. The electrolyte in this case may be HF-based organic electrolyte. The electrolyte may contain hydrofluoric acid in a range of 1% to 50%. A second surface of the substrate wafer that lies opposite the first surface may be illuminated during electrochemical etching. The electrolyte may additionally contain an oxidation agent, a hydrogen reducing agent (e.g., selected from the group of chemicals consisting of mono functional alkyl alcohols, tri functional alkyl alcohols, tri functional alkyl alcohols), a viscosity increasing agent, a conductivity modifying agent, and/or other organic additives. Electrochemical process parameters such as current density, applied voltage, and illumination intensity (if used) can be kept constant during the pore formation process. Alternatively, said electrochemical process parameters can vary at a predetermined fashion during pore growth process to provide the pores with needed variations in cross sections. Said semiconductor wafer can alternatively be of material chosen from the full possible range of alloys and compounds of zinc, cadmium, mercury, silicon, germanium, tin, lead, aluminum, gallium, indium, bismuth, nitrogen, oxygen, phosphorus, arsenic, antimony, sulfur, selenium and tellurium. The electrolyte may be an acidic electrolyte with the acid suitable for pore formation in the particular semiconductor material.

Alternatively, said porous layer can be produced by Reactive Ion Etching (more specifically be deep Reactive Ion Etching). The layer of masking material with different chemical properties than that of the semiconductor wafer may be deposited in this case on the first surface of semiconductor wafer and the openings (at the positions where pores should be disposed) should be formed in this layer through photolithography and etching (chemical or RIE) steps. The pores in semiconductor wafer then will be formed through the masking layer during reactive ion etching process.

Removal of the unetched part of the wafer can be performed through grinding, polishing, chemo-mechanical polishing, chemical etching, reactive ion etching or any other method known to those skilled in the art.

Coating the pore walls with at least one layer of transparent material can be accomplished through Chemical Vapor Deposition, thermal oxidation, liquid immersion or any other method known to those skilled in the art.

According to another non-limiting exemplary illustrative arrangement, the porous structure so obtained is sealed between two transparent plates. At least one surface of the porous layer can be coated by at least one layer of optically absorptive or reflective material.

A further exemplary illustrative non-limiting method of manufacturing a spectral filter can be accomplished by:
  making an aluminum layer having first and second surfaces, wherein said first surface is substantially flat, producing pores going through said aluminum layer, making the resultant porous aluminum layer freestanding, and
  coating the pore walls with at least one layer of transparent material.

The porous structure so obtained may be sealed between two transparent plates. At least one surface of the porous layer can be coated by at least one layer of optically absorptive or reflective material.

BRIEF DESCRIPTION OF THE DRAWINGS

These and other features and advantages provided in accordance with exemplary non-limiting illustrative embodiments will be better and more completely understood by referring to the following detailed description in connection with the drawings, of which.

DETAILED DESCRIPTION

Figure 1:
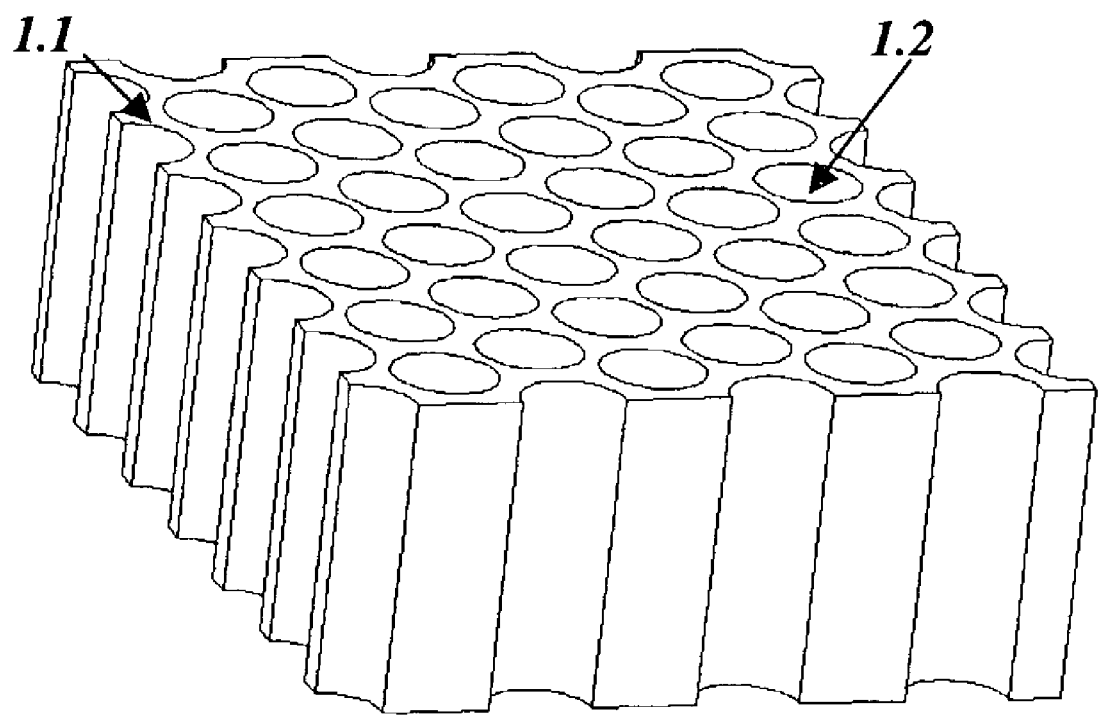
FIG. 1 is a diagrammatic perspective view of an example prior art free-standing Macroporous Silicon array of pores forming a uniform (coherent) cubic lattice.
Figure 2:
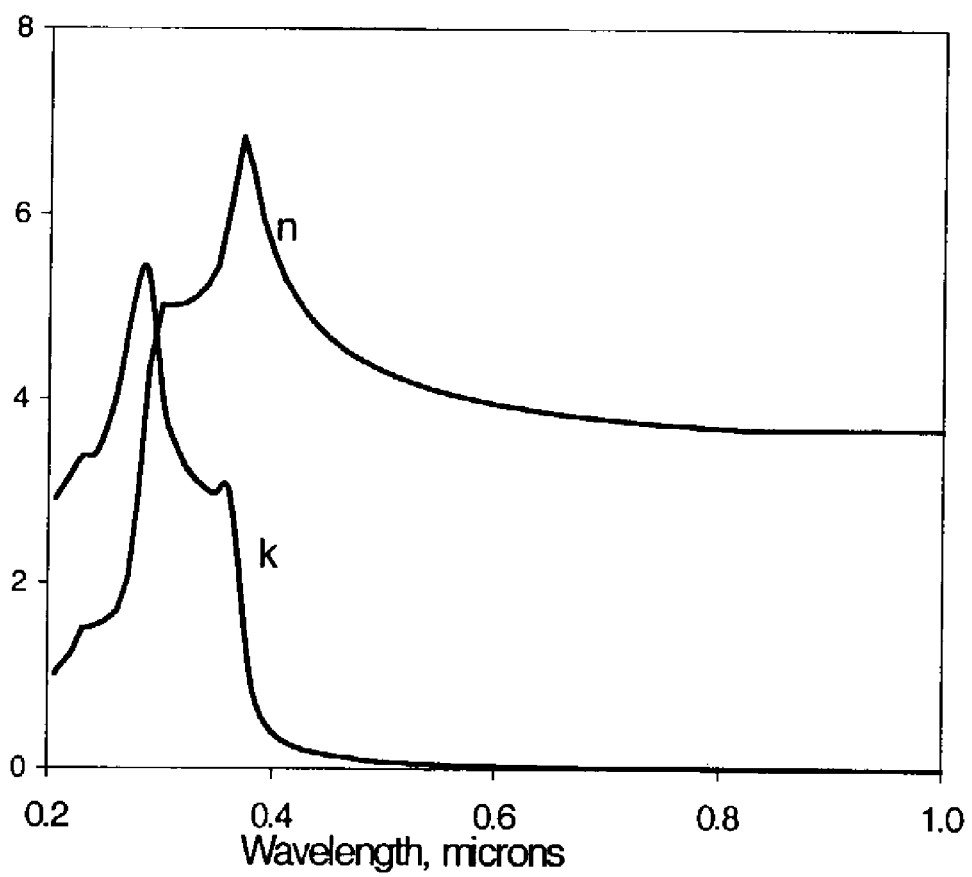
FIG. 2 is an example illustrative plot of the wavelength dependence of the real and imaginary parts of the complex refractive index of silicon in the deep UV, UV, visible and near infrared wavelength ranges.

Optimizing spectral filter performance is possible by introducing at least one layer of transparent dielectric material on pore walls by the means of deposition, growth, infiltration or any other method known by those skilled in the art. Such a layer will strongly modify the spectral dependences of the leaky waveguide mode losses by means of constructive and/or destructive interference of the light of leaky waveguide modes inside said at least one layer.

The simplest, but not the exclusive, example of such a filter structure is an MPSi layer pore walls of which are covered with just one layer of transparent dielectric. A diagrammatic perspective view of an exemplary illustrative spectral filter structure is given in FIG. 4. Such a structure consists of a semiconductor (e.g., silicon) host 2.1, pores 2.2 and a layer of transparent dielectric material 2.3 uniformly covering the pore walls. Layer 2.3 can be of silicon dioxide ($SiO_2$), thermally grown silicon oxide ($SiO_x$), silicon nitride ($Si_3N_4$), calcium fluoride or any other material known to those skilled in the art, which can be deposited, grown, sputtered or disposed by any other method known to those skilled in the art. It should be noted that layer 2.3 does not have to be transparent over the whole pass band, blocking band and/or blocking edge of the spectral filter. Depending on particular filter requirements, layer 2.3 can be sufficiently transparent either within the pass band, blocking band or blocking edge, while being transmittive, absorptive or reflective in other spectral ranges. For example, the optical thickness of layer 2.3 can be arranged such that the layer 5 serves as an antireflective layer for leaky waveguide modes for the wavelengths inside the blocking band near the initial blocking edge of uncoated spectral filter. This makes the blocking edge of the final optical filter sharper and increases the blocking efficiency inside the blocking band. In this case, layer 2.3 should be transparent near said wavelength, while it can be either transmissive, reflective or absorptive at other wavelengths. Alternatively, the optical thickness of layer 2.3 can be arranged such that layer 2.3 serves as an antireflective layer for the leaky waveguide modes for the wavelengths inside the initial blocking edge of the uncoated spectral filter to make the slope of the blocking edge of the final spectral filter sharper. In this case, layer 2.3 should be transparent within at least part of the blocking edge, while it can be either transmittive, reflective or absorptive at other wavelengths. Alternatively, the optical thickness of layer 2.3 can be arranged such that said layer 2.3 serves to increase the reflection of the leaky waveguide modes for the wavelengths inside the initial pass-band of the uncoated spectral filter to make the blocking edge of the final spectral filter sharper and to increase the overall spectral filter transmittance.

Perhaps the simplest, although not exclusive, method to fabricate such a structure is to utilize silicon as the substrate and to uniformly cover all the pore walls with a well-controlled thickness of thermal oxide. This can be accomplished easily by the thermal oxidation of the porous layer at 800–1300° C. Although in the following section only this particular case will be considered, other layers of different or the same material deposited by several different methods known by those skilled in the art, could be used instead.

Silicon dioxide grown by thermal oxidation of MPSi is an exemplary but non-limiting case, given for the illustration of the more general filter configuration.

In such an exemplary embodiment, the $SiO_2$ layer functions as an antireflection layer to inhibit the reflection from pore walls of light traveling through the pore over some wavelength range. Said range is defined by the $SiO_2$ thickness. Silicon dioxide is transparent in the visible and UV ranges and thus can serve as an antireflection layer. In the 10–150 nm wavelength range, $SiO_2$ behaves similarly to silicon, as a reflector, so the pass band is not affected much.

Figure 4:
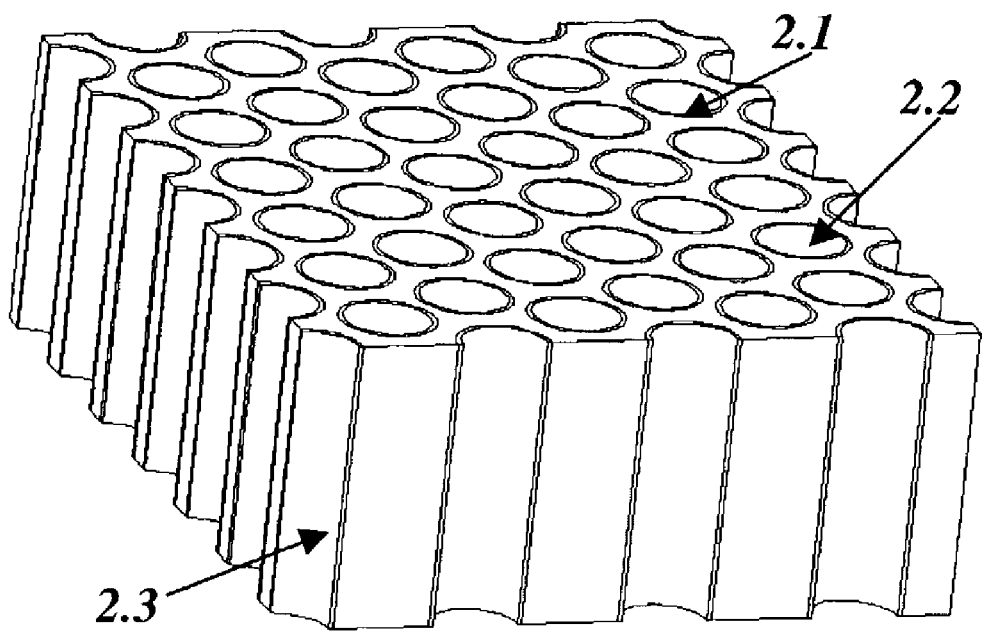
FIG. 4 is a diagrammatic perspective view of a non-limiting, illustrative exemplary preferred embodiment of free-standing uniform pore array section of a uniform cubic lattice with one layer of optically transparent material uniformly covering pore walls.
Figure 5A:
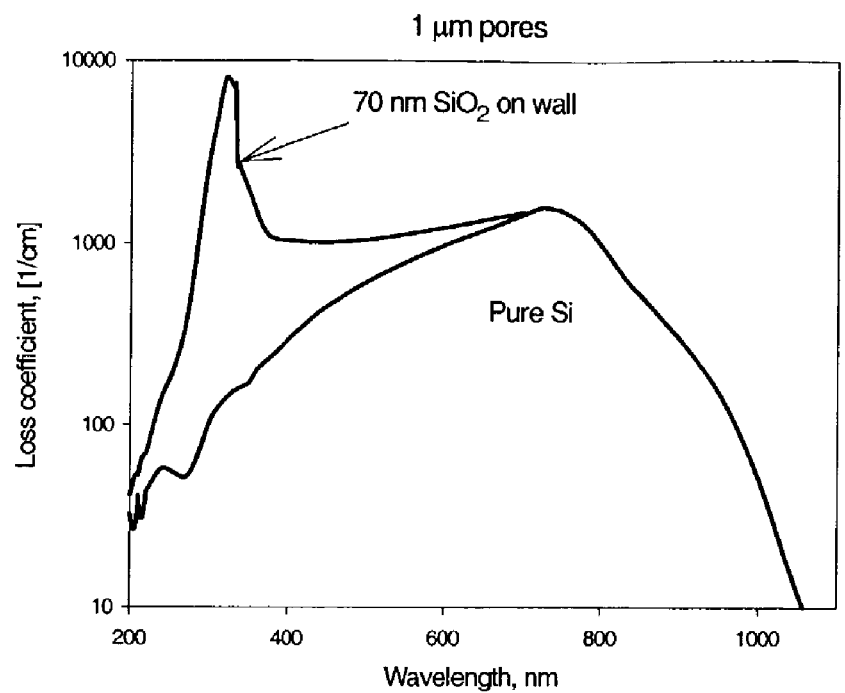
FIG. 5a is an illustrative comparative plot of numerically calculated spectral dependences of leaky waveguide mode losses for exemplary spectral filters with the structures of FIG. 1 (PRIOR ART) and FIG. 4 ($SiO_2$ covering the pore walls)—both filters incorporating pore lengths of 50 μm in this example.

Referring now to FIG. 5a, illustrative comparative plots of numerically calculated spectral dependences of leaky waveguide mode losses for the structure of FIG. 1 and for the structure of FIG. 4 having a 70 nm thick $SiO_2$ layer uniformly covering all pore walls are given for a pore cross-sectional dimension (side of a square, diameter of a circle, etc.) of 1 micrometer. The $SiO_2$ layer thickness was chosen to serve as an antireflection layer for the wavelengths inside the blocking edge of the initial MPSi filter. The suppression of the reflection of leaky waveguide modes from the pore walls causes the high and relatively narrow peak of losses centering at said wavelengths inside the initial blocking edge. The spectral position, width and shape of said loss peak are defined by the $SiO_2$ layer thickness and the dispersion properties of Si and $SiO_2$. In such exemplary arrangements, the overall suppression outside the filter transmission range is equal to or exceeds that of prior art filters, while the short wavelength slope of the loss coefficient peak is much sharper than that of the prior art filter. The losses within the pass-band of such a filter are only slightly higher than those for the prior art filters.

Figure 5B:
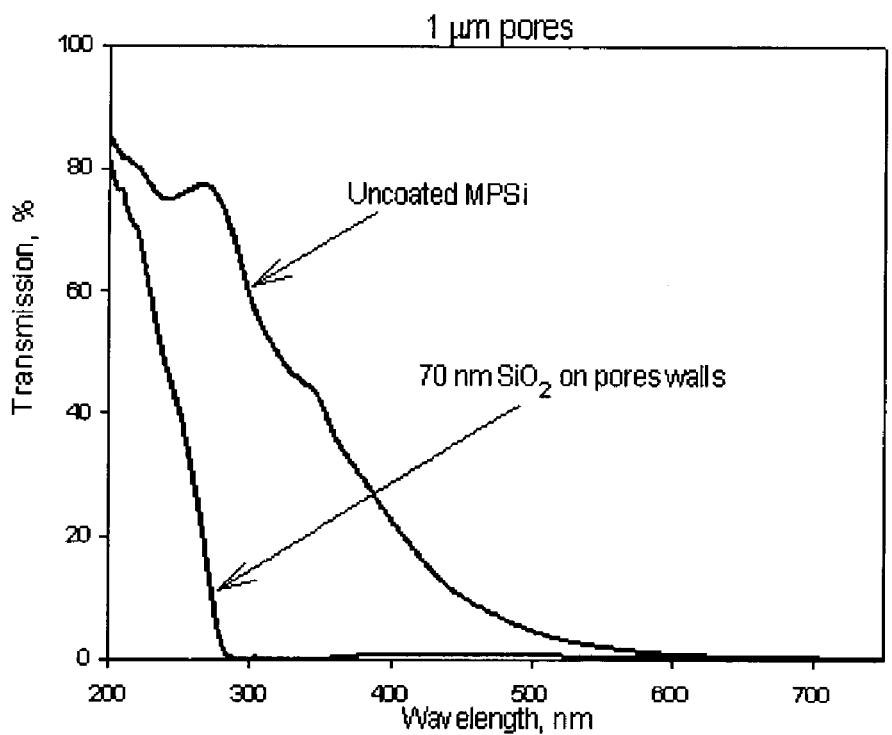
FIG. 5b is an illustrative comparative plot of numerically calculated spectral dependences of transmission through exemplary spectral filters using the structures of FIG. 1 (PRIOR ART) and FIG. 4 ($SiO_2$ covering the pore walls)—both filters incorporating pore lengths of 50 μm in this example.

Referring now to FIG. 5b, illustrative comparative plots of numerically calculated spectral dependences of transmission through the spectral filters having the structure of FIG. 1 (PRIOR ART) and the structure of FIG. 4 having a 70 nm $SiO_2$ layer uniformly covering pore walls are given for pore cross-sectional dimensions of 1 micrometer and filter thicknesses of 50 microns. The sharpening of the blocking edge in the disclosed spectral filter configuration of FIG. 4 by at least 5 times over prior art filter of FIG. 1 is clearly evident. The suppression of the transmittance within the pass band of the subject art spectral filter configuration is only about 5% less than the transmittance of the prior art filter.

Figure 6A:
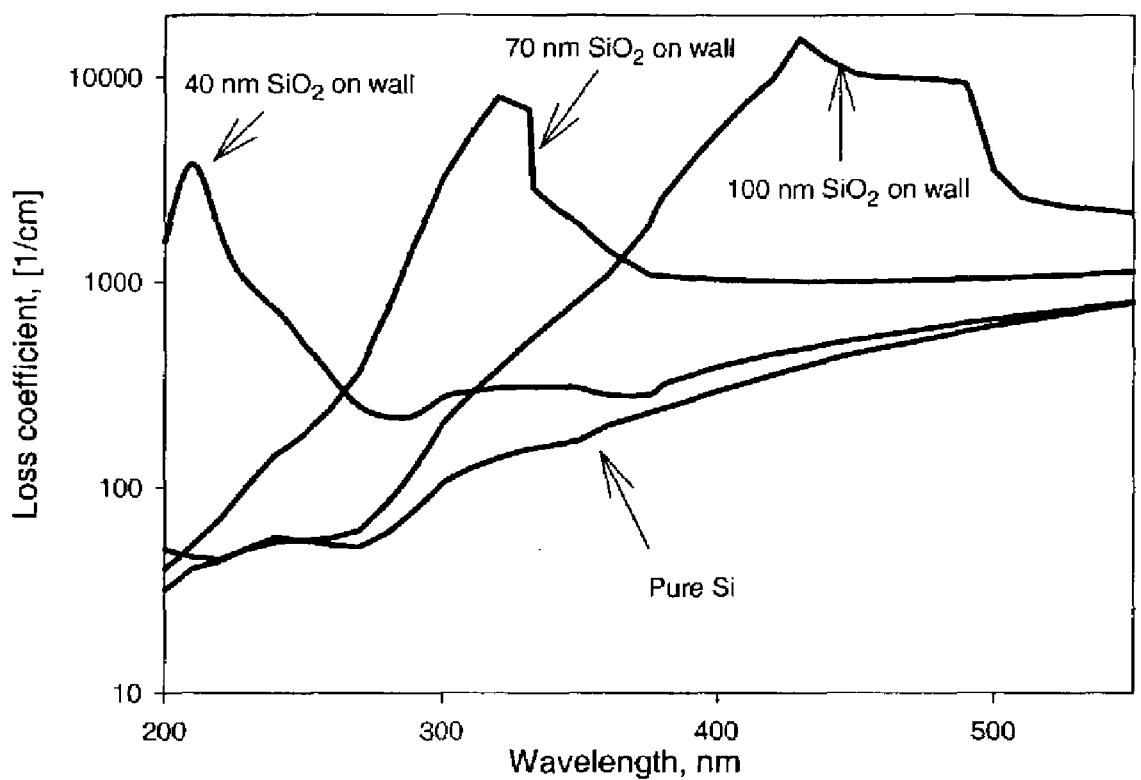
FIG. 6a is an illustrative comparative plot of numerically calculated spectral dependences of leaky waveguide mode losses for exemplary spectral filters with the structure as of FIG. 4 for different illustrative thicknesses of optically transparent layer uniformly covering pore walls.
Figure 6B:
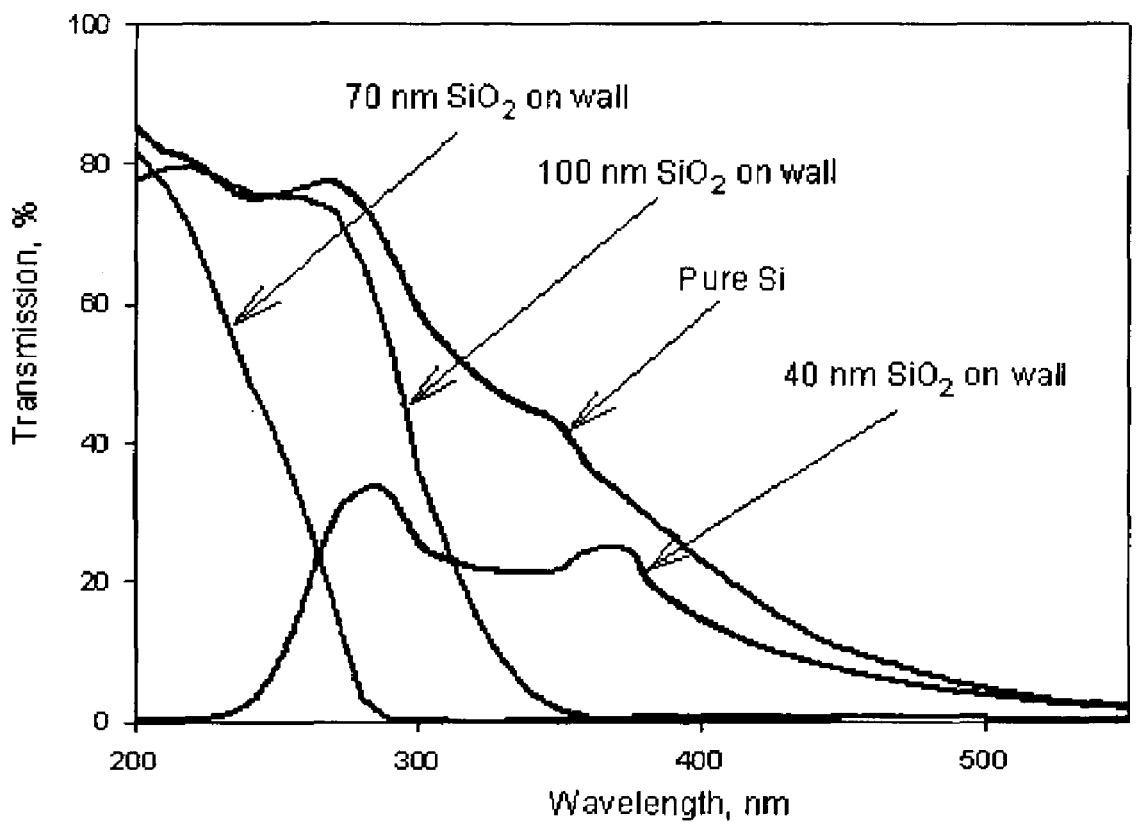
FIG. 6b is an illustrative comparative plot of numerically calculated spectral dependences of transmission through the exemplary spectral filters of FIG. 4 having 50 micron pore lengths with different thicknesses of an optically transparent layer uniformly covering the pore walls.

Referring now to FIGS. 6a and 6b, illustrative comparative plots of numerically calculated spectral dependences of leaky waveguide mode losses for the spectral filters of FIG. 4 with 1 micron pore cross sectional dimensions and 50 micrometer filter thickness (6a) and of transmission through spectral filters of FIG. 4 having and the same dimensions (6b) are given for different thicknesses of $SiO_2$ layer. It is illustrated that the spectral position of the blocking edge of spectral filters of the present embodiment can be tuned from ~200 nm to ~400 nm while retaining the advantage of the sharper absorption edge over that of prior art filters by just changing the thickness of transparent layer covering the pore walls.

Although the mechanism of improving the performance of spectral filters as disclosed herein is interference-based, such a spectral filter will not suffer from the typical disadvantages of prior art interference filters, such as the dependence of the filter blocking edge position, blocking edge sharpness, blocking efficiency and width of the blocking range on the angle of incidence of the light. Such advantageous properties can be obtained because the light-to-filter coupling process is almost independent of the loss mechanism. Dependence of the percent transmission on the angle of incidence will be closer to that of absorption-based filters (Schott glass filters, colored glass filters, etc.) and will gradually decrease when the angle of incidence deviates from the normal direction within the acceptance angle of the spectral filter, while the spectral shape of the transmission spectrum will not change.

According to a further aspect, optimization of the spectral filter performance is possible by introducing at least two or more layers (referred to herein as "multilayer") of transparent dielectric materials on the pore walls by the means of deposition, growth or any other method known by those skilled in the art. Such a multilayer will strongly modify spectral dependences of leaky waveguide mode losses by means of constructive and/or destructive interference of said mode inside said multilayer. The use of multilayer pore coverage, while adding more complexity in manufacturing, will provide much greater freedom in the filter configuration over the single layer coverage previously described.

Figure 7:
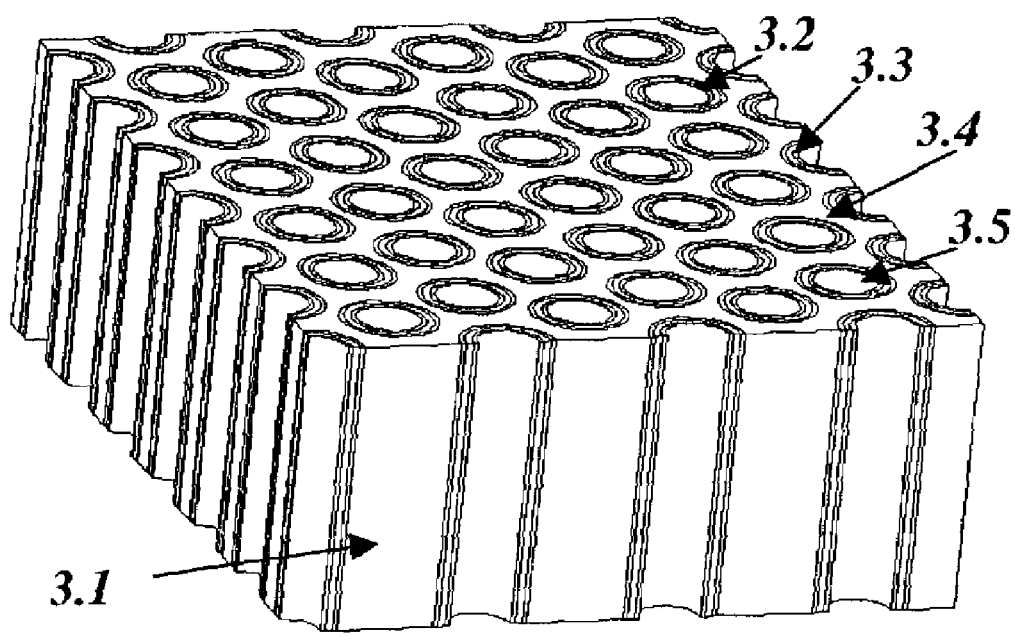
FIG. 7 is a diagrammatic perspective view of a further exemplary illustrative free-standing uniform pore array section of a uniform cubic lattice with multiple layers of optically transparent materials uniformly covering pore walls.

A diagrammatic perspective view of an exemplary porous structure with pore walls coated by a multilayer is given in FIG. 7. An example structure consists of a silicon host 3.1, macropores 3.5 and plural layers of dielectric transparent materials 3.2, 3.3, 3.4 uniformly covering pore walls. While three layers are shown in FIG. 7, the arrangement is not limited to three layers covering the pore walls. The number of layers used will be determined by the particular application requirements of the filter and can be arbitrarily large, limited only by the economic or process requirements. Layers 3.2, 3.3, 3.4 can be of silicon dioxide ($SiO_2$), silicon nitride ($Si_3N_4$), calcium fluoride or any other material known to those skilled in the art, which can be deposited, grown, sputtered or disposed by any method known to those skilled in the art. Further, it is not required that each layer within the said multilayer must be transparent over the whole pass band, blocking band and/or blocking edge of the spectral filter. Depending on a particular filter configuration, the individual layers in the multilayer can be sufficiently transparent either within the pass band, blocking band or blocking edge, while being transmittive, absorptive or reflective in other spectral ranges. Particularly, the structure of said multilayer can be chosen such that it serves as an antireflective coating for the leaky waveguide modes for the wavelengths within the blocking band near the initial blocking edge of the uncoated spectral filter in order to make the blocking edge of the final spectral filter sharper and to increase the blocking efficiency within at least part of the blocking band. In this case, each layer within said dielectric multilayer can be transparent at around the said wavelength, while it can be either transmittive, reflective or absorptive at other wavelengths. Alternatively, the structure of said multilayer can be chosen so that said multilayer serves as an antireflective coating for the leaky waveguide modes for the wavelengths within the initial blocking edge of the bare MPSi filter to make the blocking edge of the final spectral filter sharper. In this case, each layer within said dielectric multilayer should be transparent around said wavelength within the blocking edge, while it can be either transmittive, reflective or absorptive at other wavelengths. Alternatively, the structure of said multilayer can be chosen such as said multilayer serves as a layer to increase the reflection (as in a dielectric reflector) for the leaky waveguide modes for the wavelengths within the initial pass band of the uncoated MPSi filter to make the blocking edge of the final spectral filter sharper and to increase the overall spectral filter transmission efficiency. In this case, the layers of said dielectric multilayer should be transparent around said wavelength inside the spectral filter pass band, while they can be either transmittive, reflective or absorptive at other wavelengths. It should be understood that other multilayer structures configured to perform more complex functions such as simultaneously sharpening the spectral filter's transmission edge, and increasing the spectral filter transmission efficiency within its pass band or other simultaneous enhancements is entirely possible.

Figure 8A:
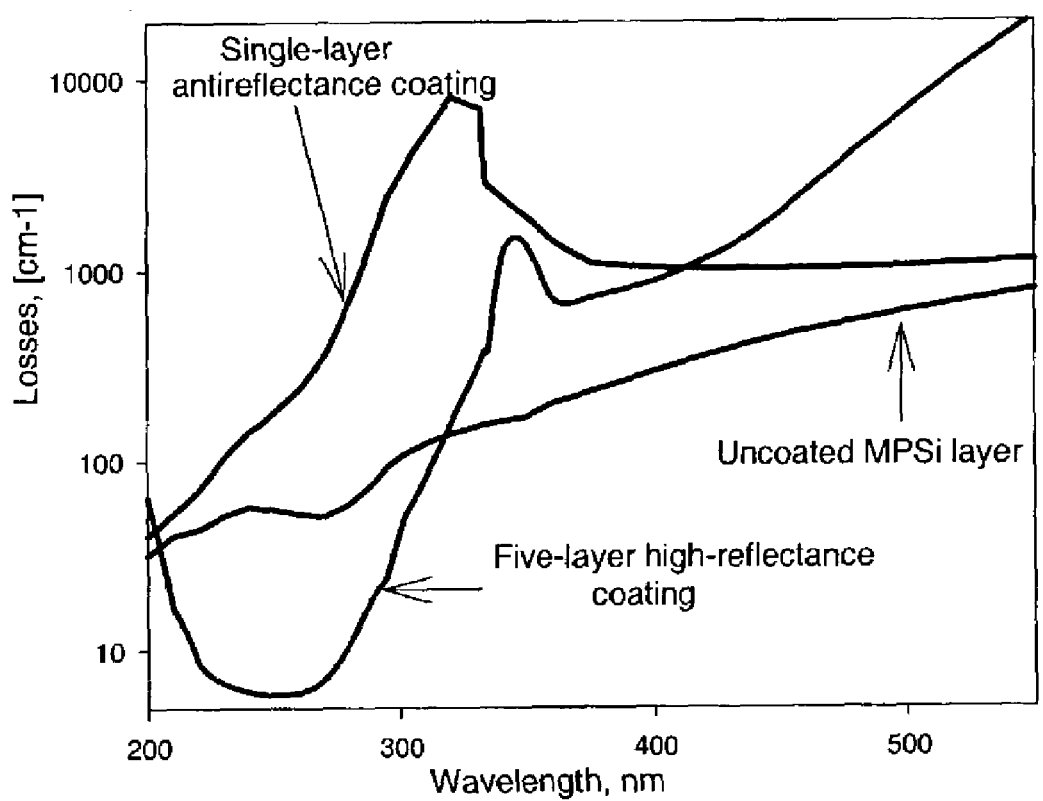
FIG. 8a is an illustrative comparative plot of numerically calculated spectral dependences of fundamental leaky waveguide mode losses for the filters of FIG. 7 with different structures of optically transparent multilayers uniformly covering the pore walls.

Referring now to FIG. 8a, illustrative comparative plots of numerically calculated spectral dependences of leaky waveguide mode losses are given for filters with pore diameters of 1 micrometer. Said illustrative structures are those of FIG. 1, FIG. 4 (for a single 70 nm $SiO_2$ layer covering pores walls) and FIG. 7 (for a multilayer pore covering consisting of five layers of alternated low refractive index/high refractive index materials). The multilayer coating was designed such as the multilayer serves as a dielectric mirror for the wavelength of 250 nm (i.e. within the exemplary spectral filter pass band). One can see that for such an exemplary embodiment (structure of FIG. 7), the blocking efficiency outside the filter pass band greatly exceeds that of prior art filters, while on the average it has the same order of magnitude as that for the filter shown in FIG. 4. The short wavelength slope of the loss coefficient peak is much sharper than that of prior art filter and sharper than that of the previously described embodiment of the present art (FIG. 4). The losses in the pass band of the spectral filter are considerably lower than those for the prior art (FIG. 1) as well as those for the previous embodiment filters (FIG. 4).

Figure 8B:
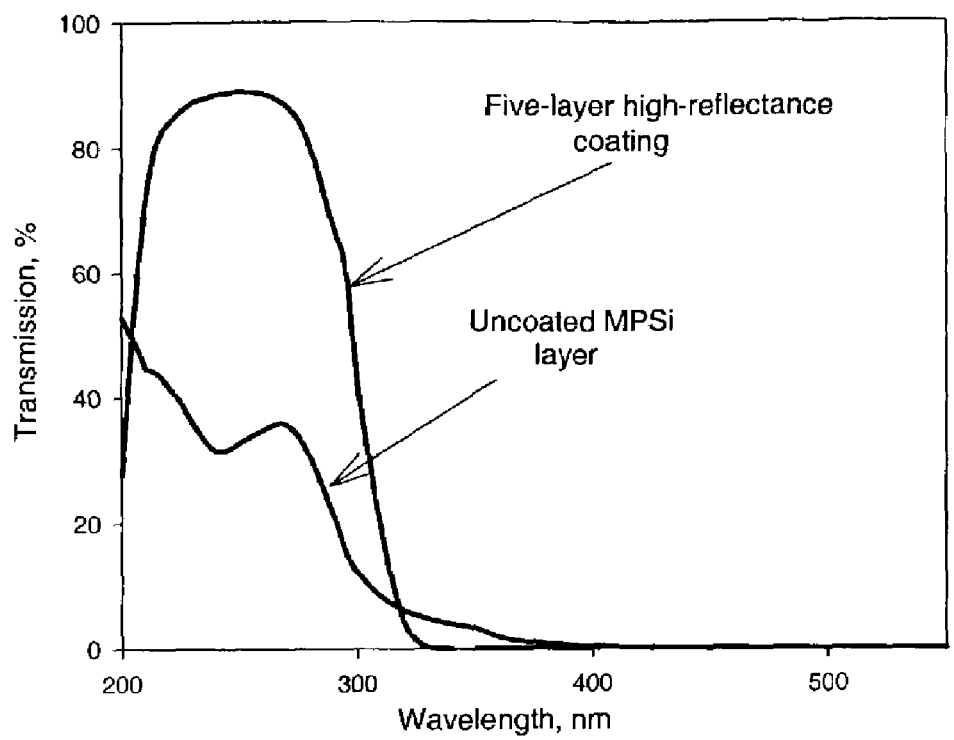
FIG. 8b is an illustrative comparative plot of numerically calculated spectral dependences of transmission for the spectral filters of FIG. 1 (PRIOR ART) and FIG. 7, both having 200 micrometer pore lengths.
Figure 8C:
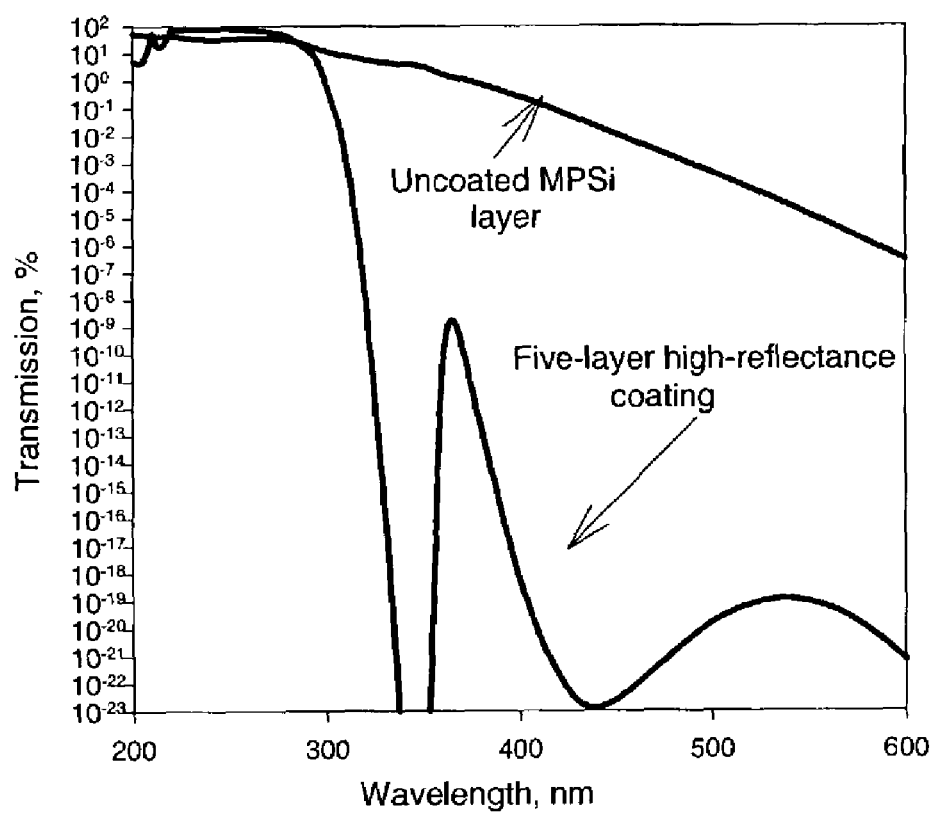
FIG. 8c is an illustrative comparative plot of numerically calculated spectral dependences of transmission for spectral filters of FIG. 1 (PRIOR ART) and FIG. 7, both having 200 micrometers thickness (transmission shown on logarithmic scale)

Referring now to FIG. 8b, comparative plots of numerically calculated spectral dependences of transmission through the spectral filters for the exemplary structures of FIGS. 1 and 7 are given for filters having pore diameters of 1 micrometer and filter thicknesses of 200 micrometers. The multilayer coating of FIG. 7 consists of five layers of alternated low refractive index/high refractive index materials) It is illustrated that for such a spectral filter configuration of FIG. 7, the blocking edge is sharper by at least ten times over the prior art filter of FIG. 1. Moreover, the transmission efficiency the pass band of such a spectral filter configuration is about two times higher than the transmission efficiency of a prior art filter for the same filter thickness. Another important advantage of such a filter configuration is that the suppression within the blocking range of 350 nm to 750 nm exceeds 8 orders of magnitude as is illustrated by FIG. 8c which is the same plot as in FIG. 8b with the transmittance on a logarithmic scale.

Figure 8D:
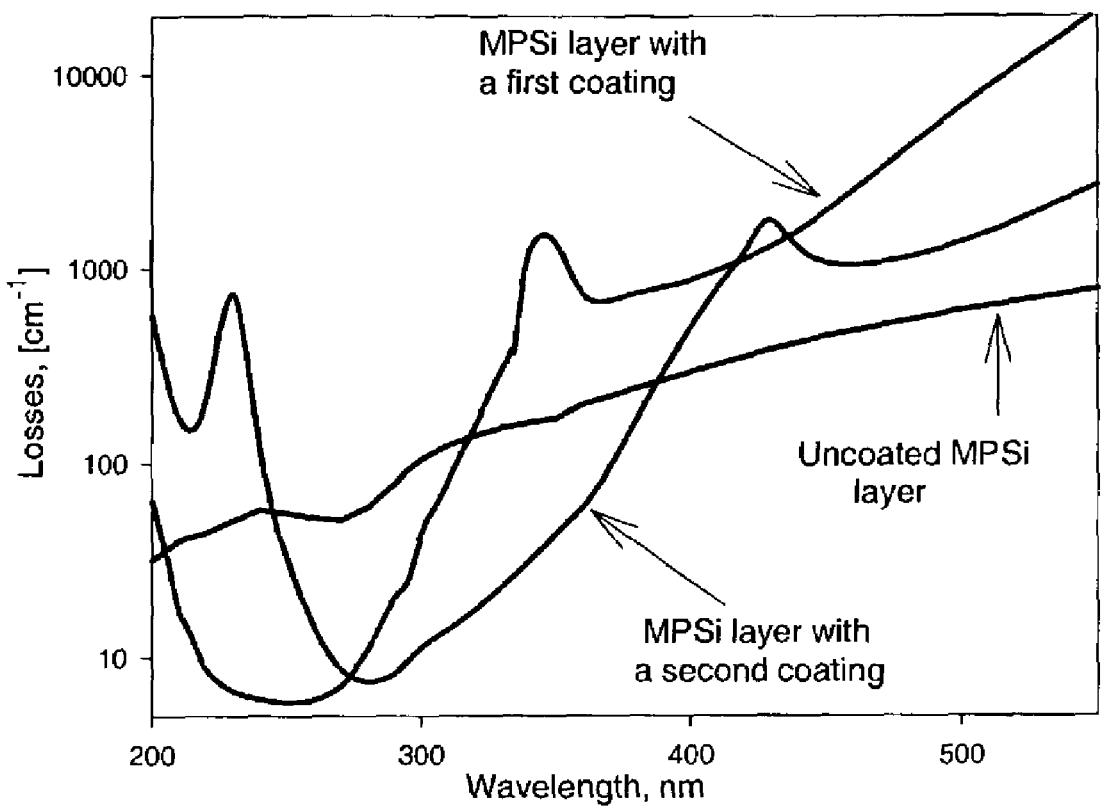
FIG. 8d is an illustrative comparative plot of numerically calculated spectral dependences of leaky waveguide mode losses for the structures of FIG. 7 with different types of optically transparent multilayers uniformly covering the pore walls.
Figure 8E:
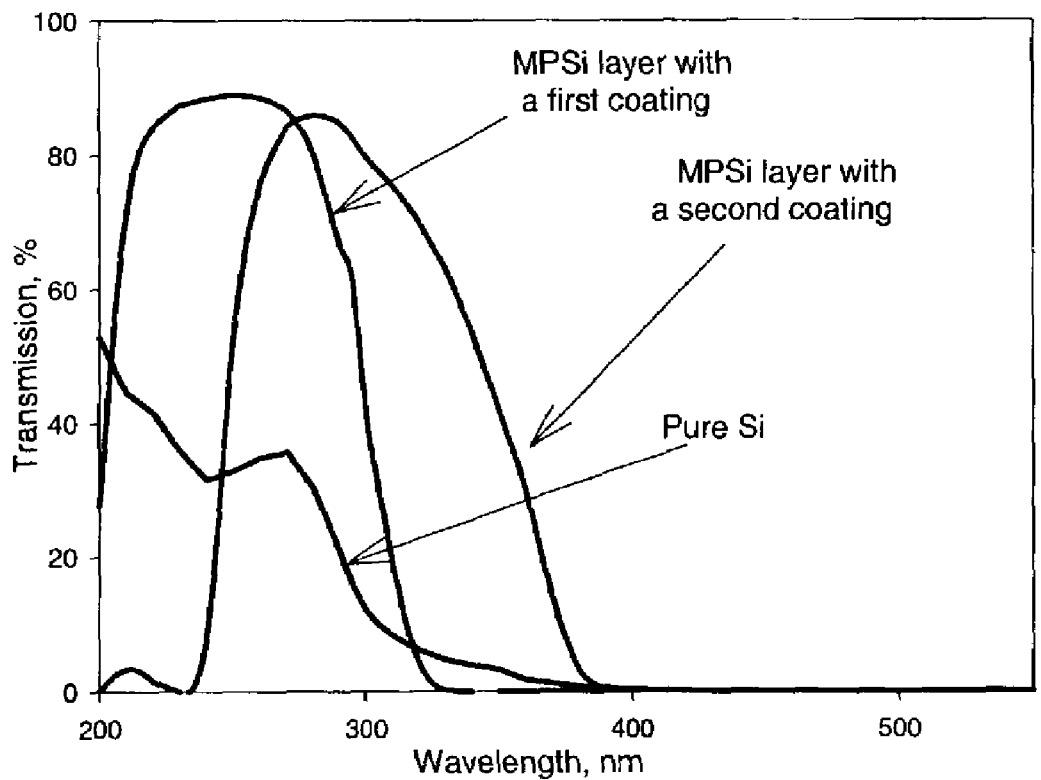
FIG. 8e is an illustrative comparative plot of numerically calculated spectral dependences of transmission through the 200 micrometer thick spectral filter of FIG. 7 for different types of optically transparent multilayers uniformly covering the pore walls.
Figure 9A:
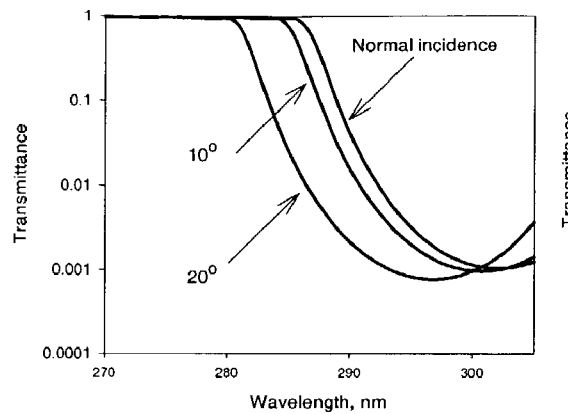
FIG. 9a is an illustrative plot of numerically calculated transmission spectra through a short-pass prior art interference filter for different angles of incidence.
Figure 9B:
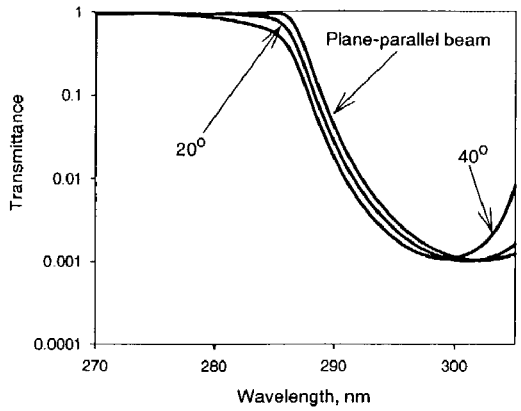
FIG. 9b is an illustrative plot of numerically calculated transmission spectra through a short-pass prior art interference filter for different divergence of the normally-incident beam.
Figure 9C:
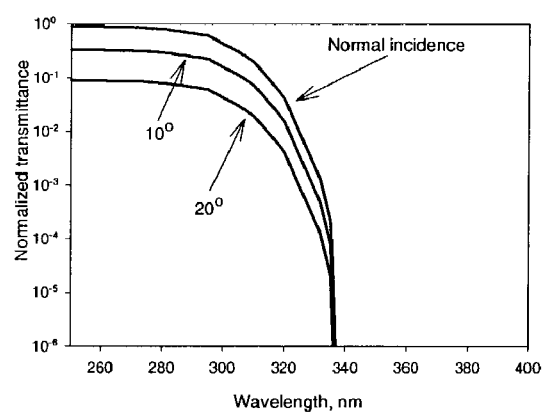
FIG. 9c is an illustrative plot of numerically calculated transmission spectra through a short-pass filter for different angles of incidence.
Figure 9D:
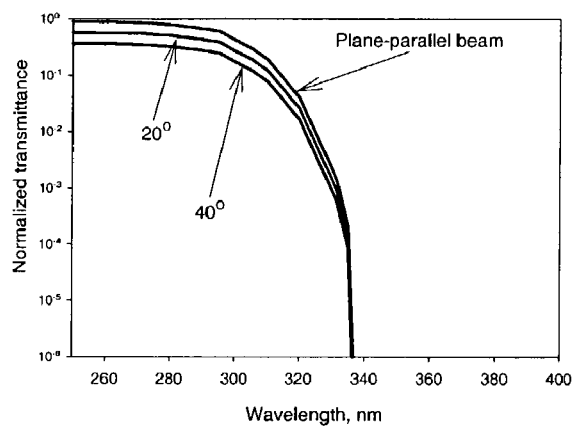
FIG. 9d is an illustrative plot of numerically calculated transmission spectra through a short-pass filter for different divergence of the normally-incident beam.

Referring now to FIGS. 8d and 8e, illustrative comparative plots of numerically calculated spectral dependencies of leaky waveguide mode losses for structures of FIG. 7 (for multilayers consisting of five layers of alternated low-refractive index/high-refractive index materials) (8d) and transmission through the same spectral filters (8e) are presented for the different multilayer coatings. It is illustrated that spectral positions of the blocking edge and the pass band of such spectral filters can be tuned from about 200 nm to about 400 nm while keeping the blocking edge much sharper and transmission efficiency considerably higher than that of prior art filters by changing the structure of the multilayer coating.

As an illustration of the advantages of the spectral filters described herein with respect to prior art spectral filters, FIG. 9 gives the exemplarily nonlimiting plots of the numerically calculated transmission spectra through prior art short-pass filters and spectral filters for different angles of incidence of a plane wave beam and different convergences (or divergences) of the incident beam. FIG. 9a shows the illustrative exemplarily numerically calculated transmittance spectra through an interference-type short-pass filter for normally incident, 10°- and 20°-tilted plane parallel beams. The wavelength shift of the pass-band edge position, common to all interference edge filters, is demonstrated. FIG. 9c presents an illustrative exemplarily normalized transmittance spectra through the spectral filter with a 5-layer coating (similar in structure to that illustrated in FIG. 8b) for normally incident, 20°- and 30°-tilted plane parallel beams. As follows from FIGS. 9a and 9c, spectral filters provide significant advantages over prior art filters and will provide the opportunity of using short-pass, band-pass or band-blocking filters at different angles of incidence (±20° at least at short wavelengths). This attribute will greatly decrease the criticality of optical alignment and provide other economic advantages. FIG. 9b gives illustrative exemplarily plots of numerically calculated transmittance spectra through the prior art short-pass interference filter of FIG. 9a for normally incident beams with different convergences: Plane-parallel beam (0-covergence angle), and Gaussian beams with 20° and 40° convergence angles. The degradation of both the band-edge shape and out-of-band rejection, common to prior art interference short-pass filter, is demonstrated. FIG. 9d presents illustrative exemplarily plots of normalized transmittance spectra through the spectral filter having a 5-layer coating for 0°, 20° and 40° convergent, normally incident Gaussian beams. It follows from FIG. 9 that the spectral filter will provide the opportunity to use short-pass, band pass and band blocking filters at convergent or divergent beams to at least convergence or divergence angles of ±40°.

Figure 3A:
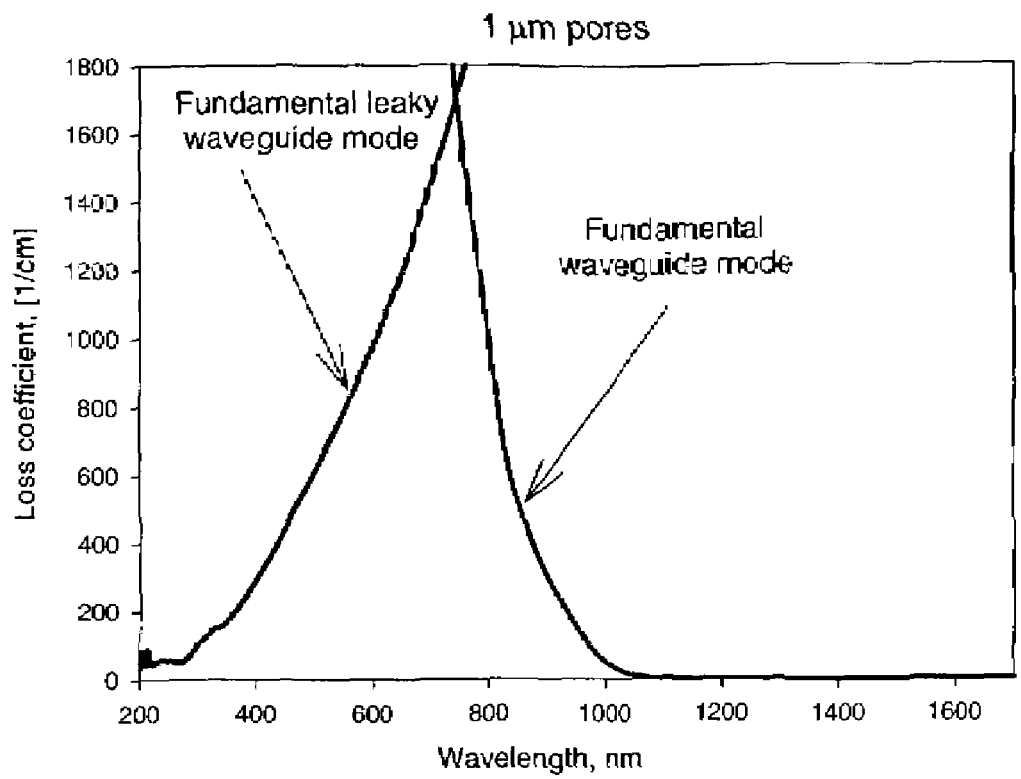
FIG. 3a is an illustrative plot of a numerically calculated spectral dependence of optical loss coefficients for a fundamental leaky waveguide and waveguide modes for the prior art MPSi filter of FIG. 1 (having 1 μm square pores)
Figure 3B:
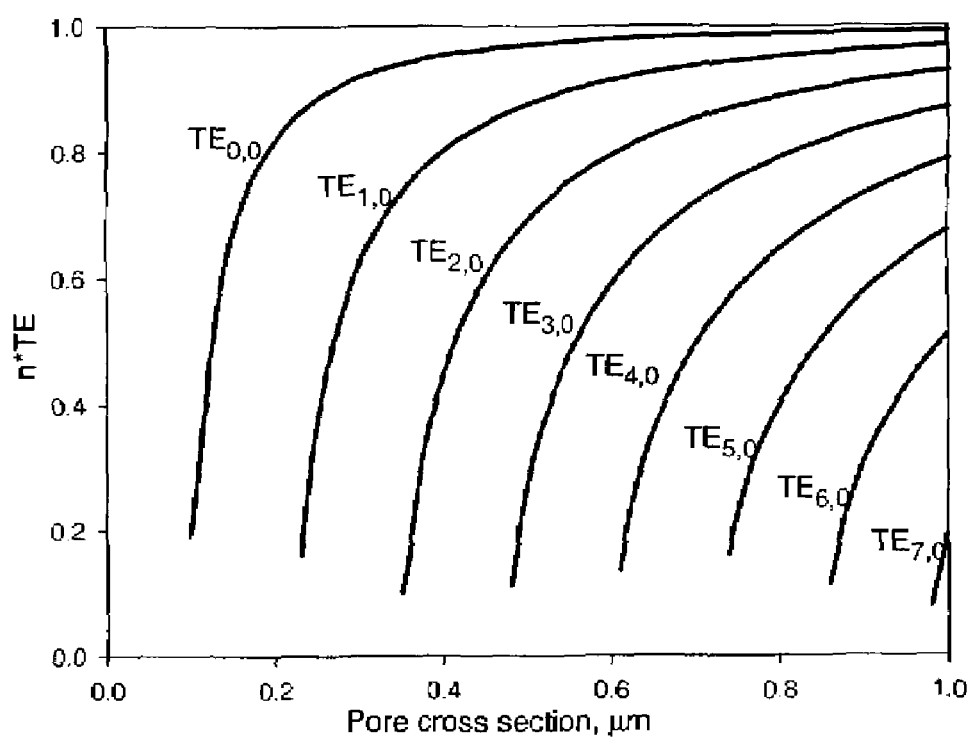
FIG. 3b is an illustrative plot of numerically calculated dependences of effective refractive indices of TE polarized leaky waveguide modes on the pore size for the structure of FIG. 1 at the wavelength of 250 nm.
Figure 3C:
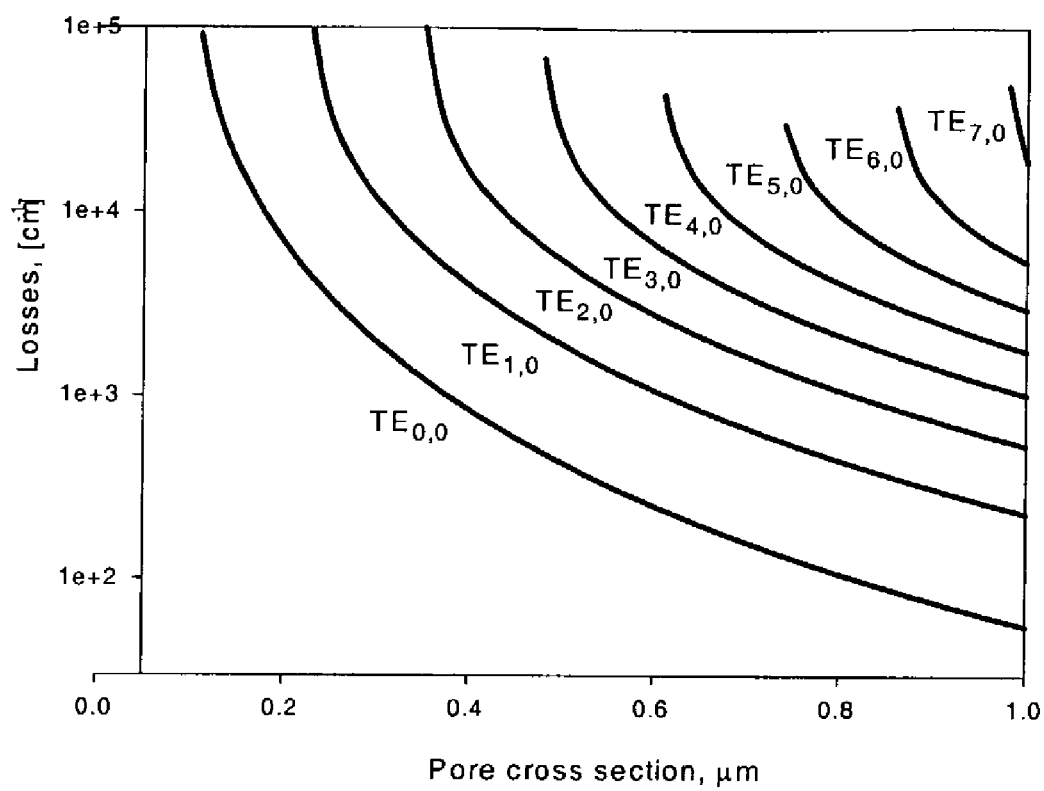
FIG. 3c is an illustrative plot of numerically calculated dependences of loss coefficients of TE polarization leaky waveguide modes on the pore size for the structure of FIG. 1 at the wavelength of 250 nm.

Another illustrative non-limiting spectral filter comprises a wafer with pores periodically modulated along their depths and with pore walls coated by at least one layer of dielectric material. A diagrammatic perspective view of an exemplary porous structure with pore walls covered with a multilayer coating and pore cross-sections being periodically modulated along the pore depths is given in FIG. 10. The effective refractive index of a pore leaky waveguide mode is a function of the pore cross-section (see, for example, FIG. 3b). As the pore cross-section in said spectral filter structure changes, so do the effective refractive index of each leaky waveguide mode. By creating such a modulation (see FIG. 10), a leaky waveguide Bragg grating in each pore will be formed. The transmission spectra of each leaky waveguide will contain in this case a characteristic transmission dip at the wavelengths correspondent to the Bragg resonance wavelength $\lambda_B$, which can be determined according to the formula: $\lambda_B = 2n^*\Lambda$, wherein $n^*$ is the effective refractive index of the leaky waveguide mode and $\Lambda$ is the spatial period of pore cross-section modulation. Since all the pores will be grown together during the same process, the modulation will be coherent. Although the transmission spectral shape of a spectral filter will be similar to that of an ordinary interference filter, the transmitted (and reflected) spectral shapes of such a spectral filter will be independent of the angle of incidence of light on the surface of the spectral filter which will greatly enhance their technical and economic usefulness over prior art filters that do not exhibit this property. It is possible to have the modulation of the pore cross-section in the form of a superimposed grating. A superimposed grating can be reduced to the linear superposition of two or more constant period pore cross sectional modulations along the length of a pore leaky waveguide (. Alternatively, modulation of the pore cross-section can be made in the form of periodic modulation with at least one phase shift in it, wherein each of said phase shifts is equal to integer multiple of $\pi$. Spectral filters made according to such a process will exhibit a narrower band-pass transmission shape, while said transmission shape will be independent of the angle of incidence within the acceptance angle range. For an economically feasible quality of narrow band pass filter, as disclosed herein, a low level of losses around the wavelength $\lambda_B$ is desirable, so the multilayer coverage of pore walls should have the structure to operate as a dielectric mirror for the leaky waveguide mode around the $\lambda_B$ wavelength. Spectral filter configurations disclosed herein will provide unique and useful spectral filtering properties that cannot be achieved using any prior art filter methods.

Figure 10:
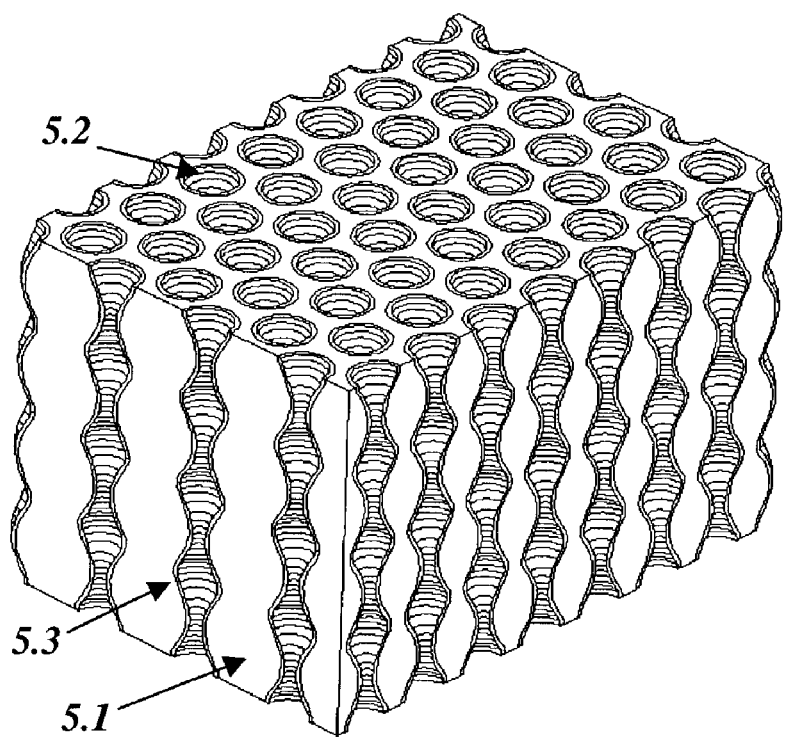
FIG. 10 is a diagrammatic perspective view of a further exemplary illustrative free-standing uniform pore array section of a uniform cubic lattice with multiple layers of optically transparent materials uniformly covering pore walls and pore cross-sections periodically modulated along their depth.
Figure 11:
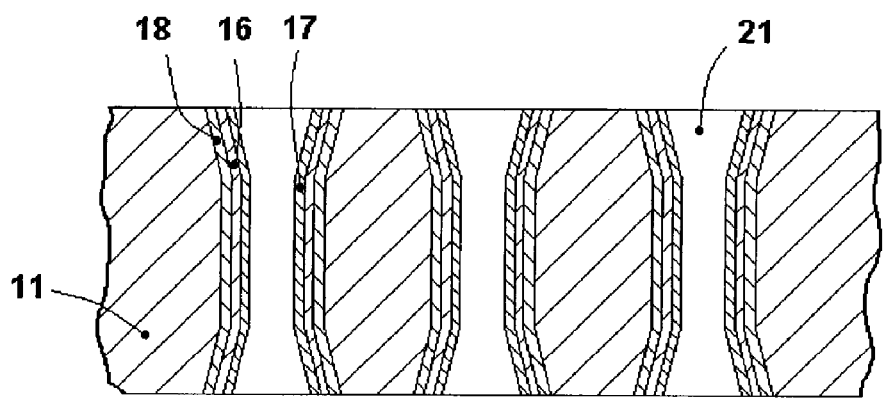
FIG. 11 is a schematic cross-sectional view of exemplary illustrative free-standing uniform pore array with tapered pore ends.

According to further aspects of a non-limiting illustrative embodiment, the spectral filter structures of FIGS. 4, 7 or 10 have through pores with adiabatically tapered pore cross-sections near the first and/or second surfaces of the spectral filter substrate wafer (as is schematically shown in illustrative FIG. 11). Tapered ends provide a gradual decrease of pore cross section from the value of the leaky waveguide (pore) cross-section at the surface of the spectral filter wafer to the value of the leaky waveguide (pore) cross-section inside the spectral filter wafer. The term "adiabatically" means that the rate of change of leaky waveguide (pore) cross-section with the depth is slow (the angle produced by the pore surface inside the tapered portion of the pore with the normal direction to the said spectral filter surface does not exceed 45°, and is preferably 10° or less). Such a tapering of pore ends can suppress by up to an order of magnitude the coupling losses of said spectral filter, while keeping the spectral filter mechanically robust.

Figure 12A:
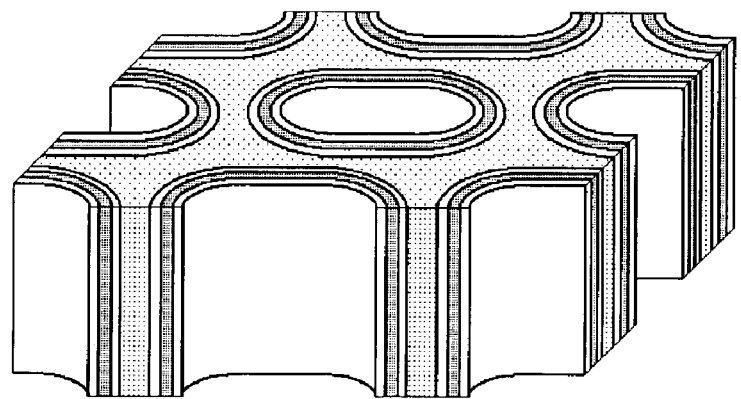
FIG. 12a is a diagrammatic perspective view of a further exemplary illustrative free-standing uniform pore array section of a uniform cubic lattice with multiple layers of optically transparent materials uniformly covering pore walls and pore cross-sections being elongated along one of the pore axes.
Figure 12B:
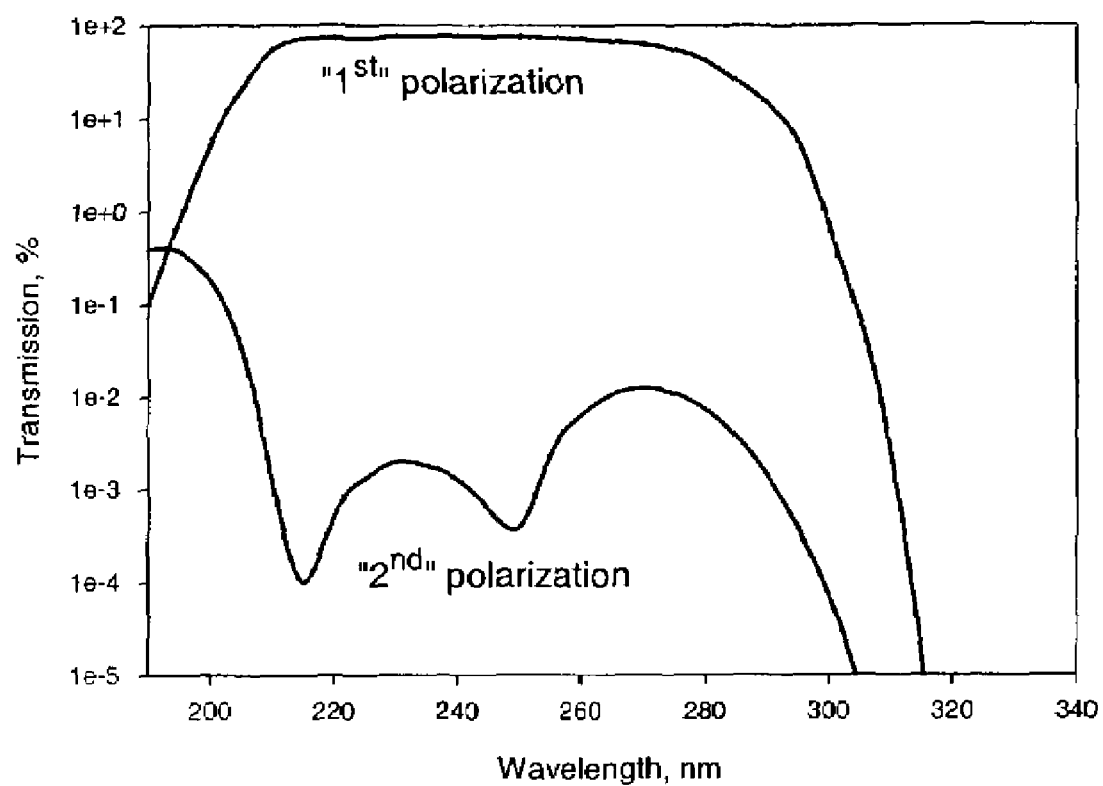
FIG. 12b is an illustrative plot of numerically calculated spectral dependences of transmission through the 200 microns thick spectral filter of FIG. 12a for different polarization states of incident light.

A spectral filter comprising a substrate wafer with uniform through pores can be used as a UV polarizer, transmitting a first polarization state and blocking a second polarization state perpendicular to the first. For a pore array to act as a polarizer, the pore cross-section should be different along different pore axes. The pores can either have a shape of an elongated ellipsoid, an oval or as a rectangle with one pair of sides being different in size than the other. A diagrammatic perspective view of such an exemplary illustrative free-standing uniform pore array section is given in FIG. 12a. Said example has a uniform cubic lattice with multiple layers of optically transparent materials uniformly covering the pore walls. It should be noted that in general, the dielectric pore wall coating is not required. For example, without any coating, such a polarizer can be made to work down to far and even extreme UV. In this wavelength range, no other transmission-type polarizers are available at all. However, to operate within the deep UV, the presence of at least one coating on the pore walls can be beneficial from the standpoint of the performance, i.e., the value of the polarization extinction, overall transmission efficiency, etc.). As an illustrative example, FIG. 12b gives a plot of numerically calculated spectral dependences of transmission through the 200 micrometer thick spectral filter of FIG. 12a In this example, the pores were assumed to have 1.3×0.7 micrometer cross-sections and a 5-layer coating on the walls. The transmission for different polarization states of incident light is computed. For comparison, prior art deep UV transmission-type polarizers (for example, polarizing cube beamsplitters) offer just a 100:1 extinction over a 30 nm wavelength band and can be operational only at wavelengths longer than about 240 nm. A polarizer as apparent from FIG. 12b, offers better than 5000:1 extinction over a 80 nm wavelength band and exhibits such a performance level starting from 210 nm.

Figure 13A:
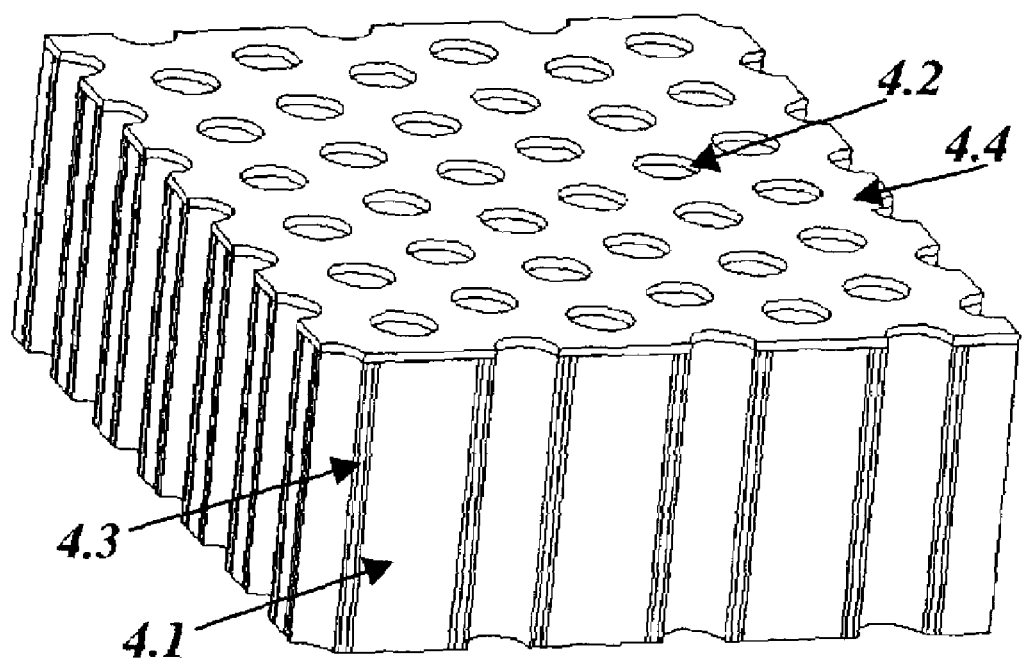
FIG. 13a is a diagrammatic perspective view of a further exemplary illustrative free-standing uniform pore array section of a uniform cubic lattice with multiple layers of optically transparent materials uniformly covering pore walls and at least one layer of reflective or absorptive material covering at least one surface of spectral filter wafer.
Figure 13B:
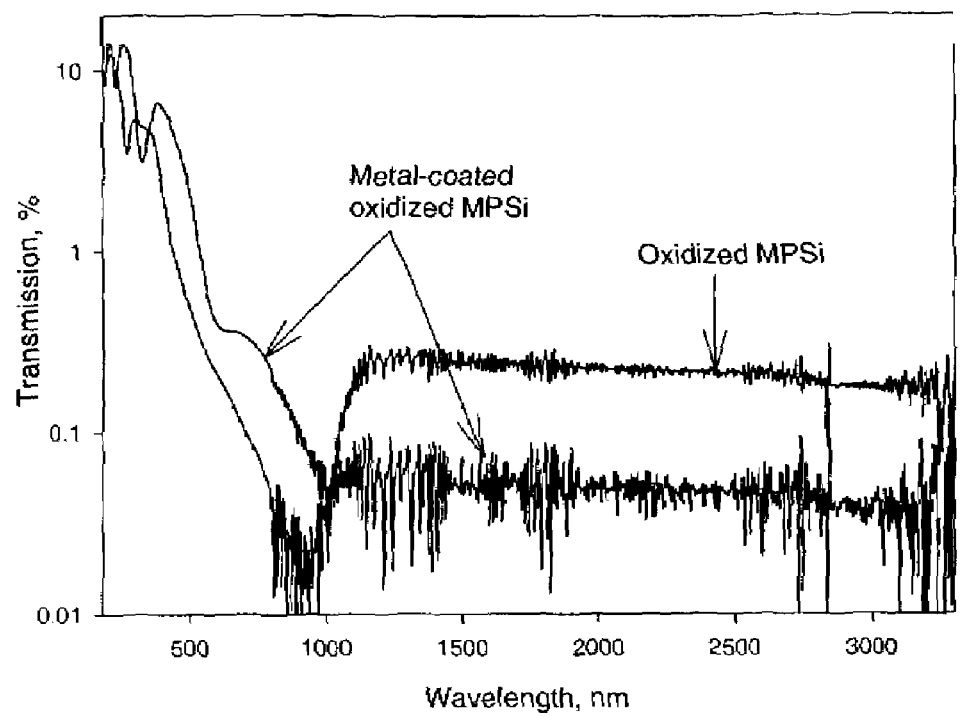
FIG. 13b is an illustrative plot of experimental spectral dependences of transmission through the approximately 220 micrometer thick spectral filter of FIG. 12a with and without an approximately 40 nm thick Ag layer covering one surface of the filter wafer.

A further non-limiting exemplary spectral filter design comprises a host wafer with uniform through-pores coated with at least one layer of absorptive or reflective material from either first, second, or both broad surfaces of said wafer to suppress the transmission through such a spectral filter of longer wavelengths. As was disclosed above, transmission through the spectral filters, if made from a semiconductor (Si, InP, GaAs, etc.), takes place through the semiconductor host above the band edge of said semiconductor (~1100 nm for Si). However, this type of transmission can be suppressed over at least part of the spectral range if the semiconductor host is coated by at least one layer of reflective or absorptive material from at least one side of said semiconductor host wafer while the pore end diameters are not restricted (i.e. remain open). FIG. 13a gives a diagrammatic perspective view of such an exemplary illustrative free-standing uniform pore array section of a uniform cubic lattice with multiple layers of optically transparent materials uniformly covering the pore walls and at least one layer of reflective or absorptive material covering at least one broad surface of the host wafer. Said at least one layer of absorptive or reflective material can be deposited by any method of deposition so at least part of pore walls stay uncoated. For example, a directional method of physical vapor deposition, such as electron beam evaporation, magnetron sputtering, or any other method known to those skilled in the art can be used. Said material can be, for example, metal, and it can block the transmission through the spectral filter of the present embodiment from the designed wavelength and above. This method provides the technological and economic advantages of a blocking band that can be unlimited toward the long wavelength side of the filter band. The structure of the pores and their walls for this exemplary arrangement can be made as described above. For example, simultaneously or in any combination in a single filter structure, the pore walls can be coated by one or more layers of dielectric materials, the pore cross sections can be modulated in a predetermined fashion along their depth, pore ends can be tapered, pores can have substantially elongated cross-sections, and a wafer surface coating can be applied. As an illustration, FIG. 13b gives an illustrative plot of the experimental spectral dependences of transmission through the approximately 220 micrometer thick spectral filter of FIG. 13a with and without an approximately 40 nm Ag layer covering one surface of the filter wafer. It should be noted that in this illustrative case pore array was not ordered (not coherent). Transmission indeed is suppressed from 1000 nm and above. For ordered arrays the filter performance is considerably better.

Figure 14A:
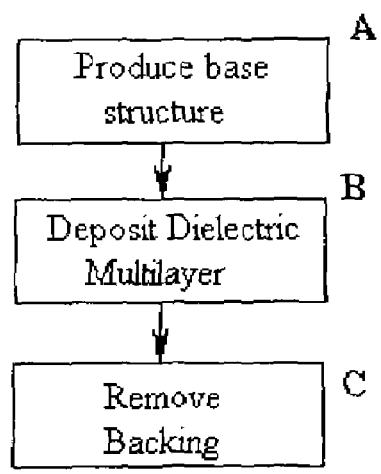
FIG. 14a is an illustrative, nonlimiting flow-chart of a method of manufacturing of spectral filters.
Figure 14B:
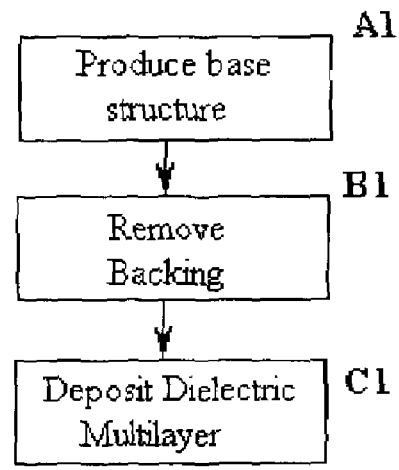
FIG. 14b is an illustrative nonlimiting flow-chart of another method of manufacturing spectral filters.

It is possible to specify several methods of fabrication of the spectral filters, but it is to be understood that those familiar with the art will be able to provide variations that will work as well. According to the sequence of the process steps used, such methods can be divided into two different embodiments, as is shown in FIGS. 14a and 14b. The first nonlimiting embodiment of the spectral filter manufacturing methods is schematically shown as a flow chart in FIG. 14a. It consists of three main steps. Step A is to produce the basic structure, which is essentially a porous structure formed in a wafer or substrate, for instance in a semiconductor, in an aluminum layer, or in a metal foil. Step B is to remove the backing, i.e., to remove the unetched, non porous part of the wafer or substrate (i.e. the part of the wafer starting from the back side that does not contain pores). Step C is to deposit a dielectric multilayer on the pore walls, i.e., coat the pore walls with at least one layer of transparent material. Other, less important, manufacturing steps can be performed in between and after these main manufacturing steps, as will be apparent from the following description.

A second nonlimiting embodiment of the spectral filter manufacturing methods is schematically shown as a flow chart in FIG. 14b. Said flow chart also consists of three main steps. Step A1 is to produce a basic structure, which is essentially the porous structure formed in a wafer or substrate, such as a semiconductor, in an aluminum layer or a metal foil. Step B1 is to deposit a dielectric multilayer over the pore walls, i.e., coat the pore walls with at least one layer of transparent material. Step C1 is to remove the backing, i.e. to remove the unetched part of the wafer that does not contain the pores. Other, less important, manufacturing steps can be performed in between and after the main manufacturing steps, as will be apparent from the following description.

Since both embodiments of the spectral filter manufacturing employ similar steps just in different order it is worthwhile to disclose these embodiment together.

Spectral filters can be manufactured by various techniques. However, since such filters necessarily contain very large numbers of through-pores, the most appropriate methods should provide the fabrication of all the pores comprising one filter (or group of filters on a host wafer) during one process. Several processes are well known in the art to provide pore arrays. These include but are not limited to, anodic etching of semiconductors (Si, InP, GaAs, and others), anodic oxidation of aluminum and deep Reactive Ion Etching of silicon. It should be noted that all of these processes are suitable for the fabrication of porous matrices for the spectral filter.

Figure 15A:
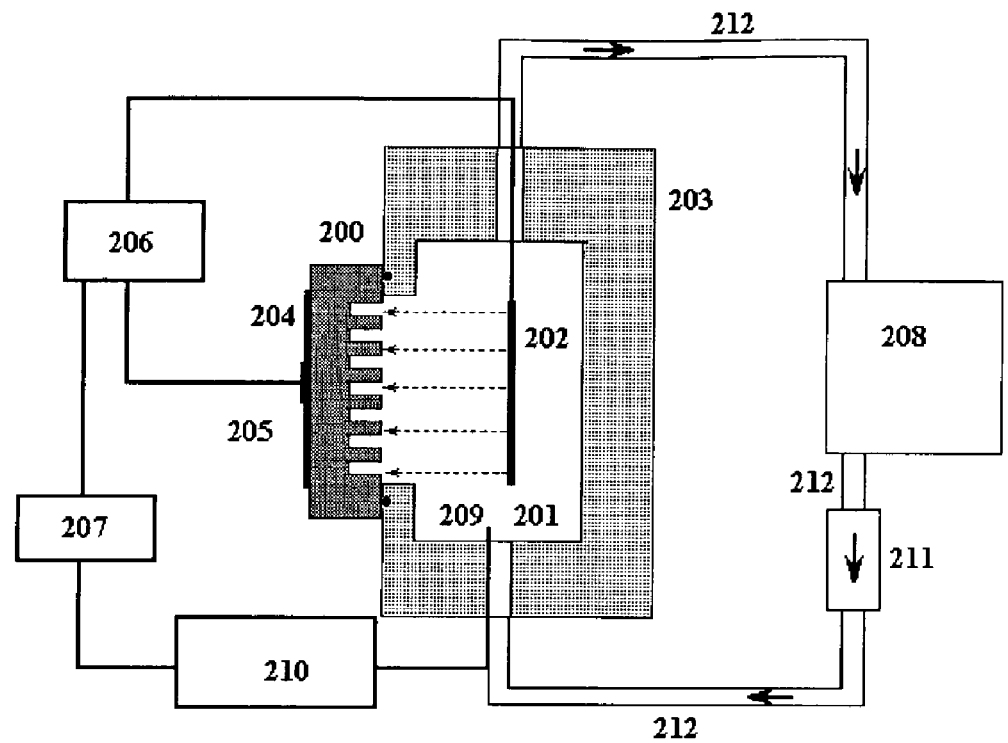
FIG. 15a is an illustrative nonlimiting schematic view of electrochemical etching apparatus for etching one wafer at a time in the absence of back-side illumination.

One illustrative, non-limiting method for the fabrication of the spectral filters will be disclosed using exemplary anodic etching of silicon. Electrochemical etching of silicon and other semiconductor materials, as well as aluminum, takes place in an electrochemical etching cell that can have several modifications according to the type of the electrochemical process used. FIG. 15a shows an exemplary illustrative schematic drawing of the etching cell that does not use any illumination (as with p-doped silicon and most of III–V compound semiconductors) and thus yields the opportunity of etching more than one wafer at a time. Such an apparatus consists of the wafer to be etched 200 (which can be either a semiconductor or aluminum) mounted by a clamping means to the chamber 203 made of chemically resistant material (e.g., Teflon™). Electrolyte 201 fills the chamber so all the wafer opening 200 is covered by it. The counter electrode 202, made of chemically inert material (e.g., platinum) is disposed in the electrolyte. The electrical contact layer 203 (e.g., a sputtered Al layer,) is deposited over the back side of the wafer to be etched. A current or voltage source 206 is connected to both the contact layer 203 and electrode 202. A computer or other controller 207 is used to control the electrochemical etching. Temperature control may be employed through temperature controller 210 and temperature sensor 209 disposed within the chamber 203. Flow-through of the electrolyte is usually desirable. For this purpose, an electrolyte reservoir 208 is used with a peristaltic or other positive displacement pump 211 and chemically resistant tubing.

Figure 15B:
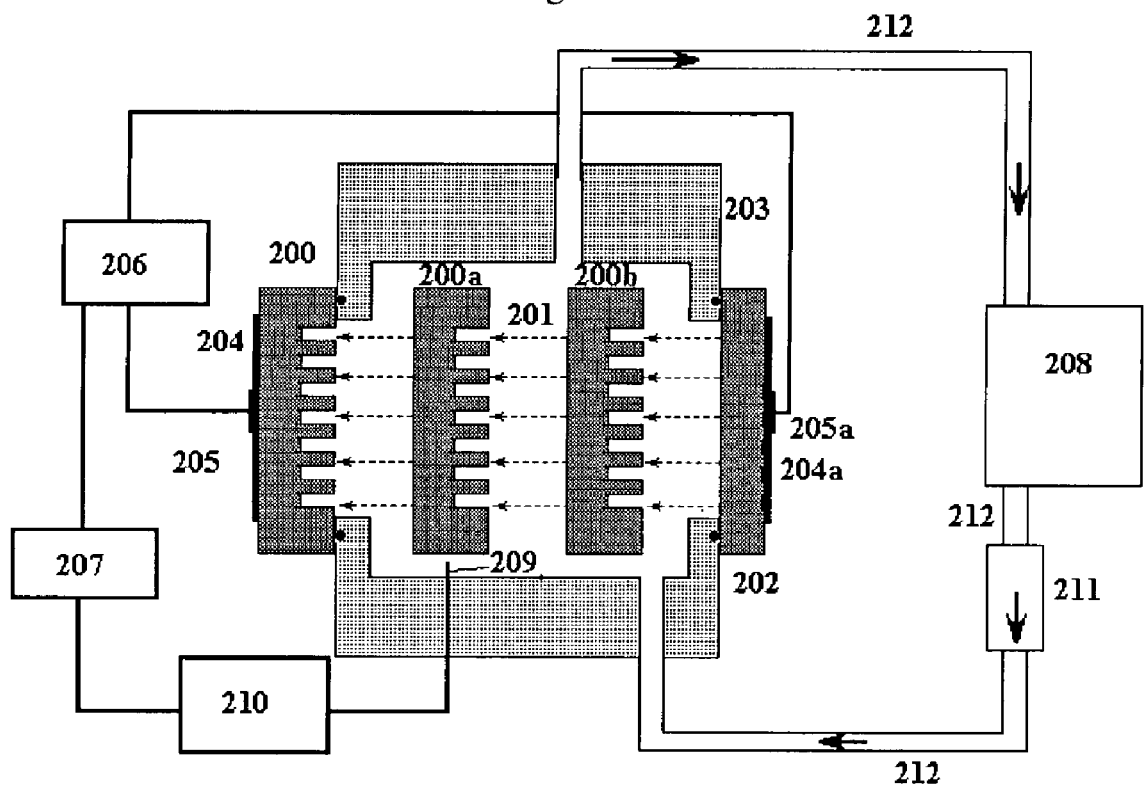
FIG. 15b is an illustrative nonlimiting schematic view of electrochemical etching apparatus for etching more than one wafer at a time in the absence of back-side illumination.

FIG. 15b shows an exemplary illustrative schematic drawing of another etching cell designed for p-type materials that does not use any illumination illustrating the ability of etching several wafers at a time. Its design is similar to that of FIG. 15a, but several wafers (200, 200a, 200b) are placed in the path of the electric current. Such a modification of the electrochemical etching apparatus can greatly reduce the cost of spectral filter manufacturing.

Figure 15C:
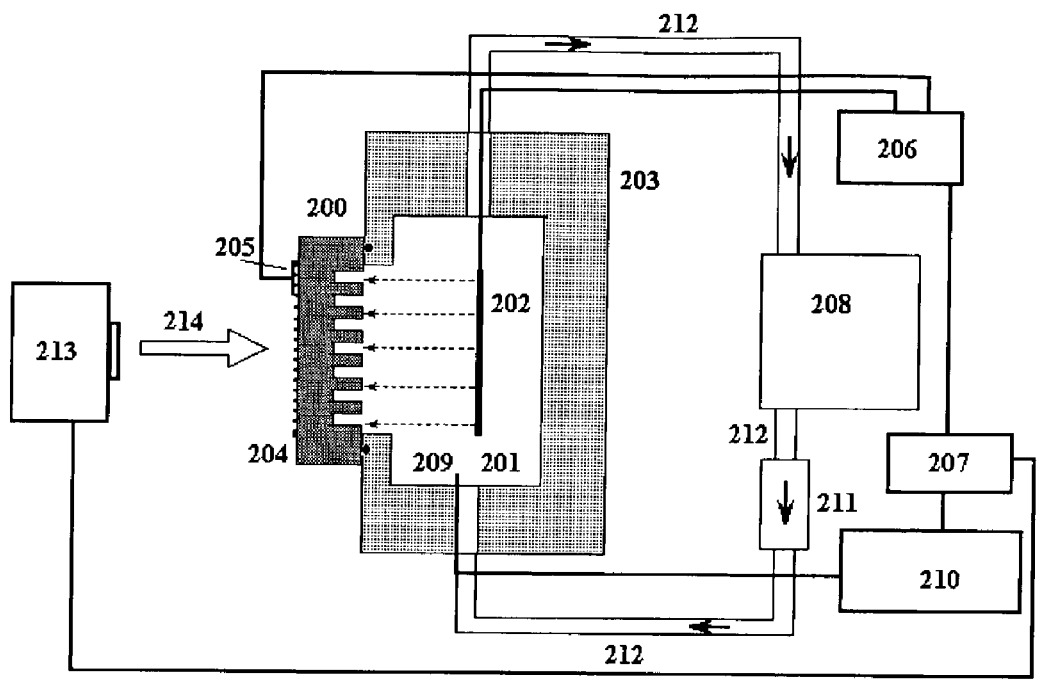
FIG. 15c is an illustrative nonlimiting schematic view of electrochemical etching apparatus for etching one wafer at a time employing back-side illumination.

FIG. 15c shows an exemplary illustrative schematic drawing of still another etching cell that provides back-side illumination (e.g., for anodization of n-doped silicon) and because of the requirement for illumination, can only etch wafer at a time. Its design is similar to those of FIG. 15a, but in addition light source 213 is used, which generates fairly intense (from 1 to 100 mW/cm$^2$) light 214 with the wavelength below the band edge of semiconductor. The electrical contact layer 204 in this case should be either transparent (such as Indium Tin Oxide) or should be perforated so the light 214 can pass through it to illuminated the wafer to be etched 200.

Another non-limiting illustrative exemplary method of manufacturing spectral filters can be better understood from FIG. 16. In this illustration, the silicon wafer case will be considered as a nonlimiting example, although it should be understood that the same method with minor modifications is equally valid with other materials listed previously. FIGS. 16a–16g show exemplary intermediate steps required to produce such a process. According to one exemplary embodiment, a host wafer, or substrate 11 (see FIG. 16a) of n-doped, single-crystal (100) orientation silicon having an electrical conductivity of, for example, 0.5 to 5 Ω cm is provided. Wafer 11 has a first surface covered with the layer 12 having thickness from 5 to 100 nm, which can be, for example SiO$_2$ or Si$_3$N$_4$, thermally grown, sputtered, or deposited by any technique known to those skilled in the art for use as a masking material. Many masking materials and deposition methods can be used, as known to those skilled in the art.

Figure 16A:
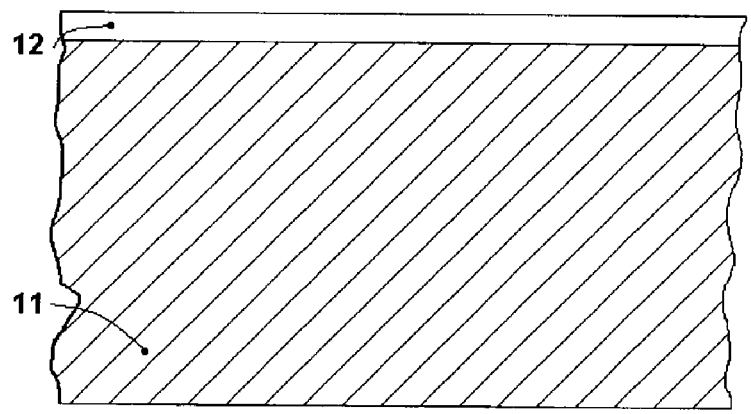
FIGS. 16a–16g are illustrative nonlimiting schematic cross-sectional views illustrating exemplary steps in the fabrication of the spectral filters.
Figure 16B:
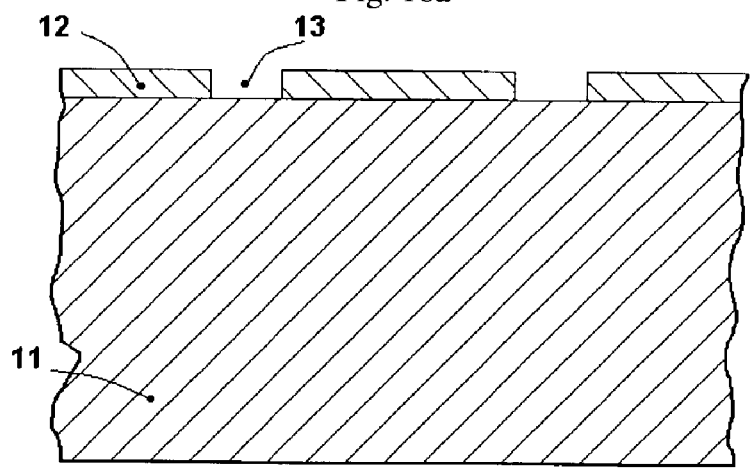

Referring now to FIG. 16b, an etching mask is produced in the layer 12 in the form of depressions 13 (usually completely through the masking material to protect the broad surface of the host wafer during subsequent starting etch pit formation) as a precursor to forming the deep pore waveguides. The pattern for the pores can be arranged regular intervals, which may include orthogonal rows and columns, a hexagonal or other repeating pattern. Such a pattern is termed "coherent" or "ordered". Depressions 13, for example, are produced with a photoresist mask with the assistance of known photolithographic methods and subsequent etching of layer 13 through said photoresist mask. The employed etching technique can be wet chemical etching, Reactive Ion Etching, Ion Milling or any other appropriate kind of etching known to those skilled in the art. Alternatively, layer 12 with features 13 can be deposited after a photolithographic and lift-off process. By another alternative method, layer 12 can be the photoresist layer itself and the features 13 can be formed by an ordinary photolithographic process if the photoresist will withstand the etch pit formation. Another illustrative method would comprise the application of the masking layers with features 13 by the method of micro-or nano-replication or stamping.

Figure 16C:
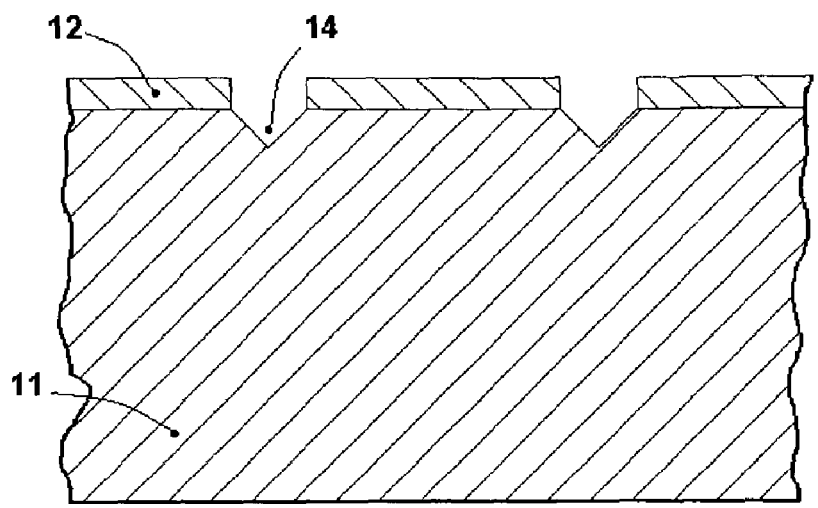

Referring now to FIG. 16c, features 13 in the layer 12 are transformed into the depressions 14 in the Si wafer 11 surface through the etching mask in the form of structured in prior step layer 12. The transformation of the surface topology from layer 12 to the first surface of silicon wafer 11 can be done by alkaline etching, acidic etching, Reactive Ion Etching, Ion milling or any other etching technique known to those skilled in the art. Although in general the depressions 14 do not have to be of the inverse pyramidal shape that can be produced by anisotropic wet chemical etching of Si (by such etchants as TMAH (Tetra Methyl Ammonium Hydroxide) or KOH, the features of this shape are preferred due to the possibility of controlling the pore positions within the depressions with the spatial precision of a few nanometers. Alternatively, surface topology 14 can be formed by light-induced electrochemical etching with an electrolyte and an illumination pattern being produced on the first surface upon employment of a light source having a wavelength less than 1100 nm. The current density in the electrolyte is set such that the anodic minority carrier current locally flows across the substrate wafer only at the illuminated locations of the illuminated pattern to create an etching erosion of the first surface at these locations to form the depressions 14. It should be noted that last method is effective only on thin (t<100 microns) silicon wafers if the pore-to-pore distances in the spectral filter have to be maintained below 10 microns.

Figure 16D:
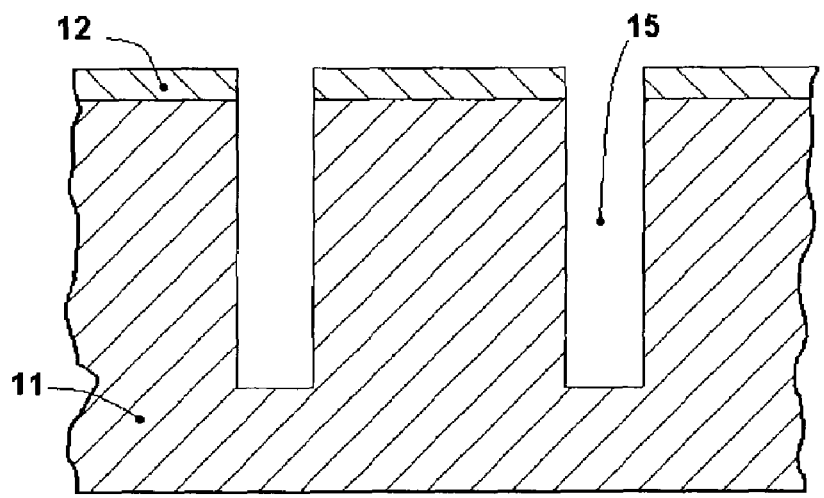

Referring now to FIG. 16d, the first surface (with depressions) of the substrate 11 is brought into contact with a fluoride-containing, acidic electrolyte. The electrolyte has a hydrofluoric acid concentration in the range of 1% to 50%, and preferably in the range of 2–8%. An oxidation agent, for example hydrogen peroxide, can be added to the electrolyte in order to suppress the development of hydrogen bubbles on the first surface of the substrate 11 during the etching process. Alternatively, the electrolyte can additionally contain a hydrogen reducing agent chosen from the group of chemicals consisting of mono functional alkyl alcohols, tri functional alkyl alcohols, such as ethanol, for example. A viscosity increasing agent, for example, glycerol, can be added to the electrolyte in order to promote better quality of the macropores. Electrolyte can also additionally contain a conductivity-modifying chemical agent or wetting chemical agent.

The substrate wafer 11 is then connected as an anode. A voltage in a range of 0 volts through 100 volts is applied between the substrate wafer 11 and the electrolyte. The substrate wafer 11 is illuminated with a light on from the backside of the wafer 11 so that a current density of, for example, 10 mA/cm$^2$, is set or obtained. In general, the current density is preferably set within the range of 4 mA/cm$^2$ through 20 mA/cm$^2$. Proceeding from the depressions 14 of FIG. 16c, pores 15 will be formed to extend perpendicular relative to the first surface of the host wafer 11. The holes 15, also known as a macropores, are produced by the electrochemical etching. A macroporous layer is, thus, formed in the host wafer 11 starting from the first surface.

Alternatively, substrate wafer 11 can be of p-doped, single-crystal (100)-orientated silicon having an electrical conductivity of, for example, 1 to 100 Ω cm. The steps of producing the depressions 14 on the first surface of wafer 11 are the same as for the n-type Si wafer case discussed above. The difference will be an electrolyte composition that should necessarily contain organic additives to promote macropore formation during the electrochemical etching process. For the case of electrical conductivity of the p-doped Si wafer 11 in the range of 1 to 10 Ω cm, the electrolyte should contain a hydrofluoric acid concentration in the range of 1% to 50%, and preferably in the range of 2–8%, and dimethylformamide (DMF) with a concentration in the range of 10 to 80%, and preferably in the range of 30 to 60%. For the case of electrical conductivity of the p-doped Si wafer 11 being in the range of 10 to 100 Ω cm, the electrolyte should contain a hydrofluoric acid concentration in the range of 1% to 50%, and preferably in the range of 2–8%. It should also contain acetonitrile (MeCN), diemethyl sulfoxide (DMSO) or DMF with a concentration in the range of 10 to 80%, and preferably in the range of 30 to 70%. Other organic additives, which serve as macropore promoters, known to those skilled in the art, can be used instead of DMF, DMSO or MeCN. In addition to said macropore-promoting organic additives, the electrolyte can contain oxidation, hydrogen-removing, wetting, viscosity- and conductivity-modifying agents, similar in function to ones disclosed above for the n-type Si case.

In both embodiments disclosed above, the electrochemical etching is performed during a time required to form a macroporous layer with a thickness predetermined by the spectral filter design considerations. This time can be estimated for constant cross-section macropores as a ratio t/GR where t is the desired MPSi thickness while GR is the macropore growth rate, which is unique for every combination of electrolyte composition and silicon wafer conductivity, and also proportional to the applied current density. The proper growth rate can be found before the filter process begins through calibration runs. It should be noted, however, that GR is not constant during the electrochemical etching and gradually decreases with the depth of the porous layer. This should be taken into account during any spectral filter fabrication process. Current density and other electrochemical process parameters can be kept constant during the time of pore formation. Alternatively, electrochemical process parameters can be constantly changed in a predetermined fashion. For example, current density can be slowly increased during the MPSi formation time to compensate for the dependence of pore cross-section on the depth of the pore.

According to another exemplary embodiment, the electrochemical etching process parameters (such as, for example, current density or backside illumination intensity) can be changed during etching run with a periodical or near-periodical fashion to produce an MPSi layer with periodically modulated macropore cross-sections. In addition, according to another embodiment, the electrochemical etching process parameters (such as, for example, current density or backside illumination intensity) can be changed during etching run such that tapered pore ends are formed on both the first surface of Si wafer 11 and near the deep ends of the pores. This can be accomplished by, for example, setting an initial current density of 15 mA/cm$^2$, linearly changing it to 8 mA/cm$^2$ during first 20 minutes of the etching process, fixing the current density at 8 mA/cm$^2$ for the time needed to grow pores with the necessary depth, and then linearly changing the current density up to 15 mA/cm$^2$ during the following 20 minutes. The examples given herein do not preclude other changes of electrochemical parameters. After the electrochemical etching process is complete, the Si wafer having macropores 15 is removed from the electrochemical etching apparatus. The wafer should be carefully cleaned to insure the electrolyte is removed from the deep macropores. It should be noted that the pore walls usually exhibit some roughness causing scattering on an optically significant scale after the etching process, not to be confused with intentional pore diameter modulation. For the best performance of spectral filters it may be desirable to suppress this roughness. In one illustrative, non-limiting method, the pore walls are oxidized by thermal oxidation and the thus formed silicon dioxide layer is etched away, for example in HF.

Figure 16E:
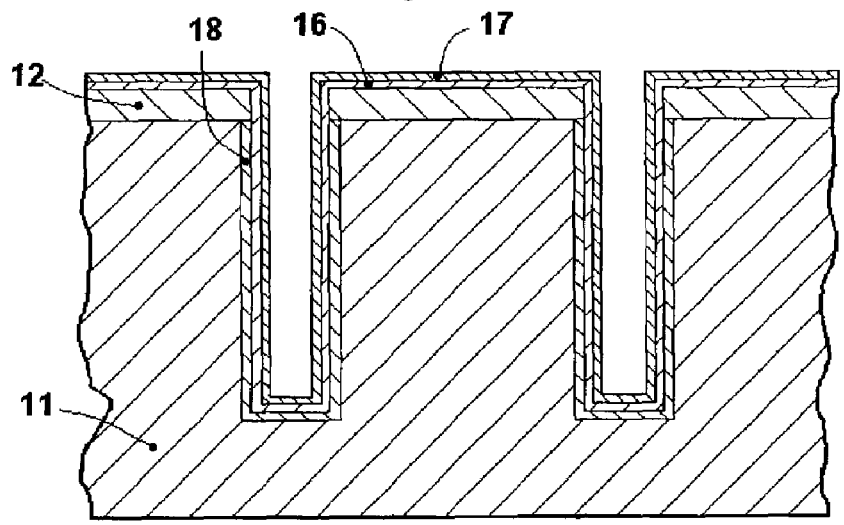

Referring now to FIG. 16e, the first surface of the silicon wafer 11, together with the pore walls, is covered uniformly by the at least one layer of dielectric material. Layer 18 layer can be, for example, grown by the thermal oxidation of said silicon wafer 11 in an oxygen atmosphere at temperatures of 950–1300° C. The thickness of such a thermal oxide layer is well-controlled by the time and temperature of oxidation, according to well known semiconductor processes. In order to reduce oxidation-caused stress in such an MPSi film, the wafer can be annealed for 1 hour in a nitrogen atmosphere at temperatures of 400–800° C. Alternatively, layer 18 can be $SiO_2$ deposited, for example, by Chemical Vapor Deposition (CVD), Low Pressure Chemical Vapor Deposition (LPCVD), or atomic layer chemical vapor deposition (AL-CVD). Although thermal oxidation is the least expensive technique, the CVD and especially LPCVD or ALCVD will produce lower stress layers. All other layers (16, 17 on the exemplary illustrative embodiment of FIG. 16e) of said transparent multilayer can be deposited by, for example, CVD, LPCVD, ALCVD or MOCVD (Metal-Organic Chemical Vapor Deposition) techniques. Said layers 16, 17, 18 on the exemplary illustrative embodiment of FIG. 16e comprising said transparent multilayers covering the pore walls can be of $SiO_2$, $Si_3N_4$ or any other transparent dielectric material known to those skilled in the art and can be vacuum deposited or grown by any other suitable technique, such as chemical vapor deposition, known by those skilled in the art.

Figure 16F:
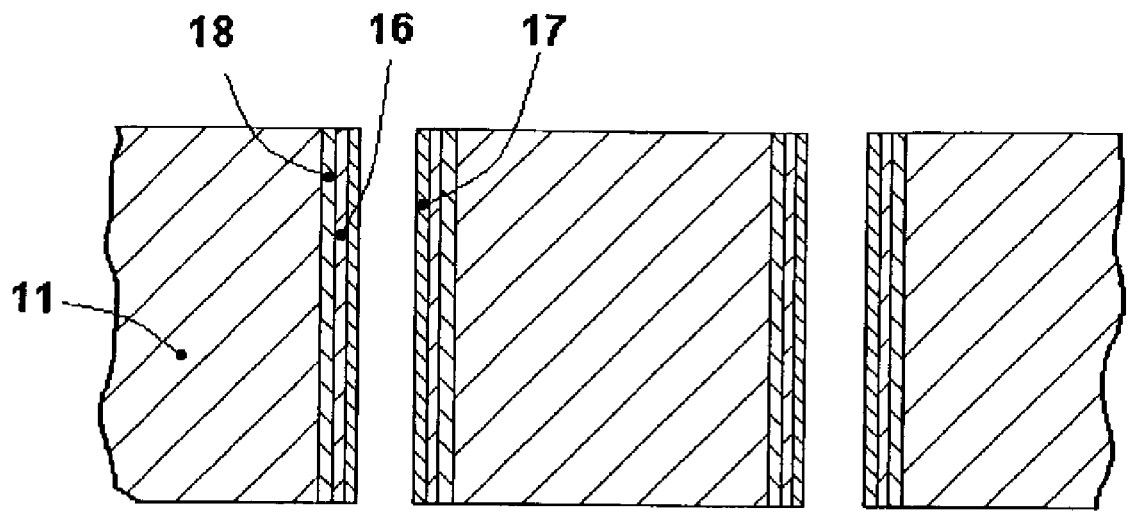

Referring now to FIG. 16f, the portion of the silicon wafer 11 not having the MPSi layer, but within the overall pattern boundaries, is removed. Removal of the said portion of wafer 11 can be done by, for example, the alkaline etching of the bulk silicon from second surface of silicon wafer 11 until the MPSi layer is reached. The etching can be done in, for example, a 40% by weight KOH-water solution at a temperature in the range of 70° to 90° C., but preferably 75° to 80° C. Alternatively, removal of said non-porous portion of wafer 11 can be done by, for example, by acidic etching of the second surface of silicon wafer 11 until the MPSi layer is reached. According to a further embodiment, removal of said portion of wafer 11 can be done by, for example, the mechanical polishing of the second surface of silicon wafer 11 until the MPSi layer is reached. According to a still further exemplary embodiment, removing of said portion of wafer 11 can be done by, for example, the chemical-mechanical polishing of the second surface of a silicon wafer 11 until the MPSi layer is reached. In accordance with still another embodiment, removing of said portion of wafer 11 can be done by, for example, reactive ion etching. It should be noted that mechanical or chemical-mechanical polishing of the second surface of said wafer can be required even after most of said portion of wafer 11 is removed by any of the aforementioned means in order to achieve the necessary flatness of the second surface of the final spectral filter. It should also be noted that polishing of the first surface of said wafer 11 can also be required at times in order to achieve the necessary flatness of the first surface of the final spectral filter. In a further exemplary embodiment, the starting wafer thickness can be chosen to equal the desired depth of the pores if the mechanical strength of the final structure is sufficient or can be made sufficient to maintain the integrity of the spectral filter.

In accordance with another exemplary embodiment, removal of the portion of the silicon wafer 11 that does not have the MPSi layer is carried out before the deposition of a transparent multilayer on the pore walls. This method can be advantageous for CVD, LPCVD, MOCVD or ALCVD methods of deposition, since the flow of gas can be directed through the pores insuring the uniform coverage of pore walls throughout the whole depth of said pores.

By following the spectral filter manufacturing steps disclosed herein, functional spectral filters can be produced. Such filters can be used at ultraviolet or shorter wavelengths, for instance, in vacuum or low moisture atmospheres. Operation of such a filter under high humidity conditions can encounter difficulties. These problems may be caused by the porous structure of the filter, known to be prone to absorbing moisture from the atmosphere below the dew point because of the high surface area and capillary-sized pores. In order to provide a viable commercial product, encapsulation of the filter layer in an optically and/or chemically compatible manner that will protect it from contaminants in the atmosphere may be required at times. Special care during the choice of the encapsulation method must be taken to avoid autofluorescence from the encapsulating material.

Figure 16G:
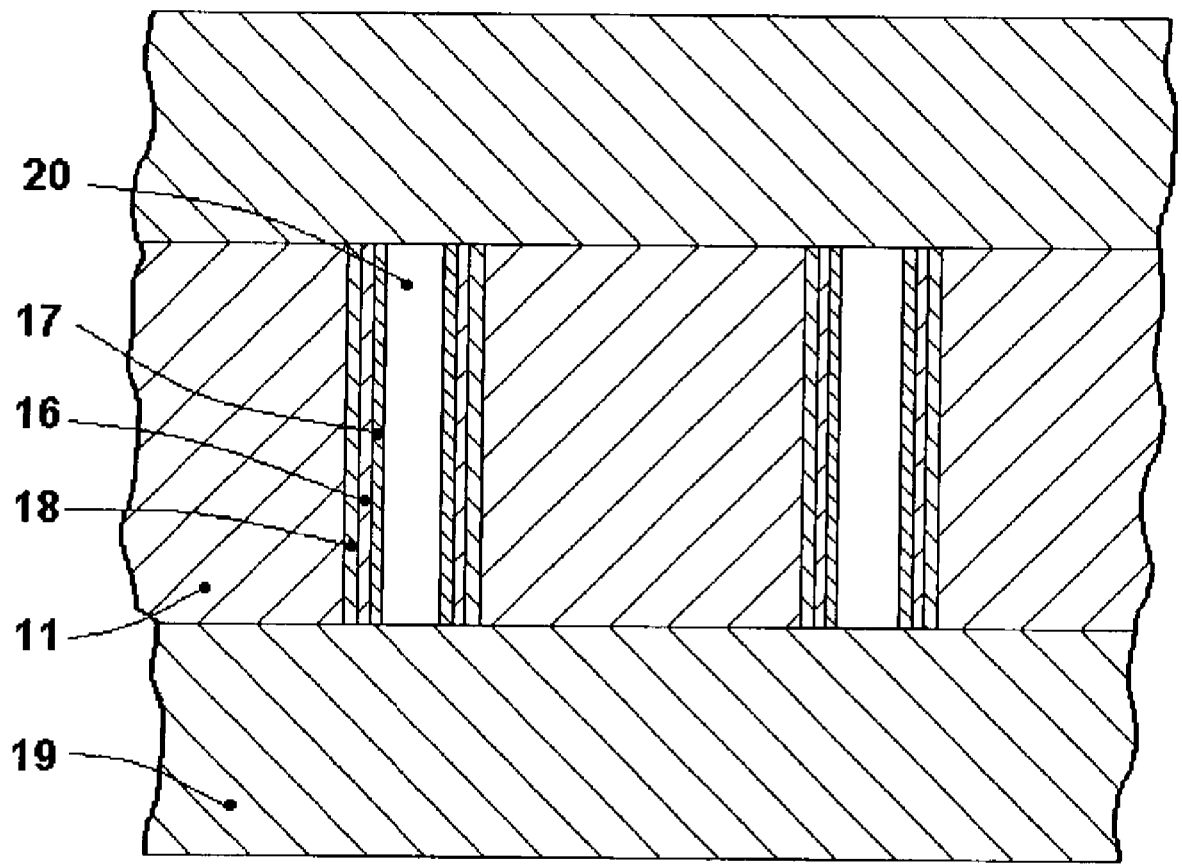

Referring now to FIG. 16g, the first and second surfaces of the MPSI silicon filter wafer 11 are covered by the polished wafers 19 of a material that is transparent in the pass-band of the spectral filter. According to one illustrative embodiment, wafer 19 is of UV grade quartz with an ionic surface treatment, and the attaching of wafer 19 to said silicon wafer is done by anodic bonding or thermal bonding. Bonding can be done in a vacuum atmosphere to insure that the material 20 filling the pores is transparent down to at least absorption edge of silica (~145 nm). According to a still further exemplary embodiment, wafer 19 is of UV grade quartz, UV grade fused silica, or any other material transparent within the pass-band of said spectral filter and the attachment of wafer 19 to said silicon wafer is accomplished through epoxy around the edges of said filter, to insure that the working surface area of said filter is free from epoxies and epoxy-caused autofluorescence is avoided. Any other method of sealing the porous structure known to those skilled in the art can be used to encapsulate the porous layer in place of the above example methods.

Set forth hereafter are details concerning specific experimentation examples using the methods of manufacturing. The details of these examples may be varied to an extent and are not taken as limiting of the present invention. These examples have been chosen and set forth merely to illustrate and describe the concepts but are not intended to be limiting.

EXAMPLE 1

The p-doped, double-side polished (100) Si wafer used in this process was obtained from a commercial vendor to conventional semiconductor specifications, but with a 200 nm $SiO_2$ layer covering each surface. The resistivity was in the 58.9–62.8 Ohm*cm range as provided by the vendor. The wafer was then patterned on one side by a second commercial vendor to create holes through the $SiO_2$ at predetermined locations. The pattern was of round holes spaced 2.5 microns apart and having diameters of 1.25 microns in a pattern of cubic symmetry. The axes of the pattern were oriented by 45° with respect to the crystallographic axes of the silicon wafer. In order to start the pores in the locations of the photolithographically patterned holes in the oxide, the wafer was placed into a hot aqueous solution of KOH (40 weight percents at 80° C.) for 2 minutes so etch pits were formed inside the openings in the $SiO_2$. Next, the wafer was placed into a 48% HF aqueous solution for 2 minutes to remove the $SiO_2$ layer and then rinsed in flowing de-ionized water for 2 minutes. Next, 50 nm of gold was magnetron sputtered onto the back side of the wafer. The wafer was then mounted into an anodization chamber filled with electrolyte having composition 30[HF]+70[Ethanol]+160[DMSO] by volume. The opening of the chamber was about 1.5 inch in diameter while the wafer was 2×2 inch on a side, so not all the wafer was exposed to electrolyte. The counter electrode of Pt-coated Nb mesh was placed parallel to the wafer at a distance of 3 inches. Both wafer and electrode were connected to a current source operated in the constant current mode. A constant current of 40 mA was applied. The etching was performed during 6 hours at room temperature. After this time, the current was shut-off, the wafer was removed from the electrolyte and cleaned in water for 2 minutes and isopropanol for 1 minute. The wafer then was placed into Aqua Regia acid for two minutes to remove the gold layer from the back side and was carefully cleaned in water and isopropanol again. The wafer was then slowly inserted into a hot (1000° C.) oxidation tube for 4 hours to form an oxide layer on all surfaces. Then the wafer was placed into a Reactive Ion Etching machine and an opening in the oxide layer from the back side (circular, 1 inch in diameter) was formed by etching through a photoresist mask. The wafer then was waxed by its first surface to a glass 2×2 inch wafer and placed into a hot KOH solution (the same as during etch pit process) for 12 hours. By this means, the non-porous part of the silicon wafer was removed. The wafer was then placed into an acetone bath for 6 hours to strip it from the glass plate and to remove the wax. A functional short-pass filter consisting of a free-standing MPSi layer with a 200 nm $SiO_2$ layer covering the pore walls was thus formed.

EXAMPLE 2

The method in Example 1 was repeated but improved by increasing the smoothness of the pore walls (reducing the optical scattering). To suppress the roughness, the $SiO_2$ layer was etched off the pore walls in HF (5 minutes in 48% aqueous solution under agitation). The wafer was then cleaned in de-ionized water for 5 minutes and was placed into the hot tube furnace (1000° C.) for 2 hours a second time to re-form a layer of silicon dioxide on the pore walls. A functional short-pass filter consisting of a free-standing MPSi layer with about 120 nm of $SiO_2$ covering the smoothed pore walls was thus formed.

EXAMPLE 3

In a third example, a p-doped double-side polished (100) higher-resistivity Si wafer, a different electrolyte and a long-wavelength suppression layer applied to the second surface of the MPSi layer were used. The resistivity was in the 67.9–73 Ohm*cm range as measured by the vendor. The wafer was oxidized in the hot tube (1000° C.) for 4 hours, producing 200 nm of oxide on all surfaces of the silicon. The wafer was photolithographically patterned from the first side of the wafer (i.e. holes in a photoresist layer were formed at the predetermined locations). The pattern was of cubic symmetry with round holes spaced 5 microns apart and having diameters of 2.5 microns. In this example, the axes of the pattern were oriented parallel to the crystallographic axes of the silicon wafer. The photoresist pattern was transferred into the $SiO_2$ layer through a reactive ion etching process. The subsequent etch pit formation and anodization steps were the same as in Example 1, except that the electrolyte was chosen to have the composition 25[HF]+70 [Ethanol]+160 [MeCN] by volume. The etching and oxide formation processes of Example 2 were followed to provide smoothed, oxide-covered walls. In addition, a thin (~50 nm) layer of Ag was then deposited by thermal evaporation onto the second surface of the wafer. This completed a functional short-pass filter consisting of a free-standing MPSi layer with a 200 nm $SiO_2$ layer covering the pore walls and one surface coated by an absorptive material The Ag layer functioned to absorb all wavelengths to the long wavelength side of the absorption edge of the filter.

EXAMPLE 4

In this example, the steps of Example 1 were followed except a lower resistivity wafer and a different electrolyte composition were used and mechanical removal of the unwanted silicon in the pore array area was employed. The resistivity was in the 20–40 Ohm*cm range as measured by the vendor. The electrolyte had the composition 1[HF]+2 [Ethanol]+12 [DMF] by volume. After the pores were etched and the gold removed, the wafer was mechanically polished from the back side until the porous layer was reached. During this process, the wafer was waxed by its first surface to a glass 2×2 inch wafer to provide mechanical support for the MPSi layer during the polishing step. After the unwanted silicon was removed, the wafer was then placed into acetone for 6 hours to strip it from the glass plate. The wafer was cleaned in multiple fresh rinses of acetone to completely remove remaining wax. The oxidation step was then performed, providing a functional short-pass filter consisting of a free-standing MPSi layer with 200 nm $SiO_2$ layer covering pore walls.

Figure 17A:
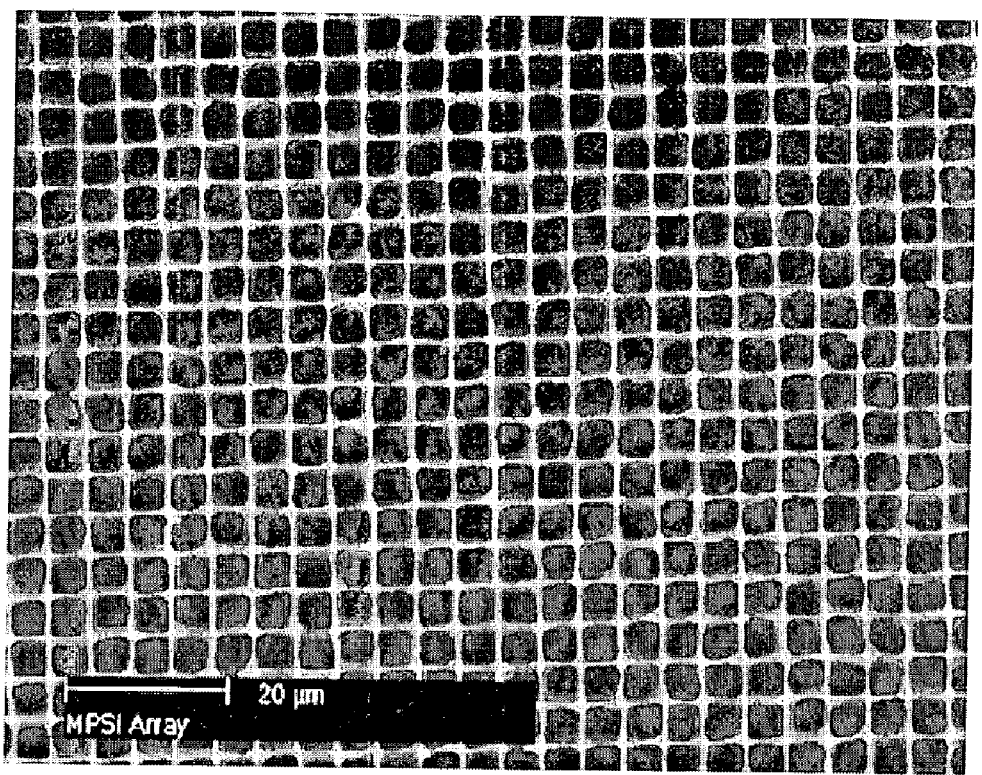
FIGS. 17a–17b are illustrative SEM images of the first surface of the filter wafer having different pore configurations in silicon.
Figure 17B:
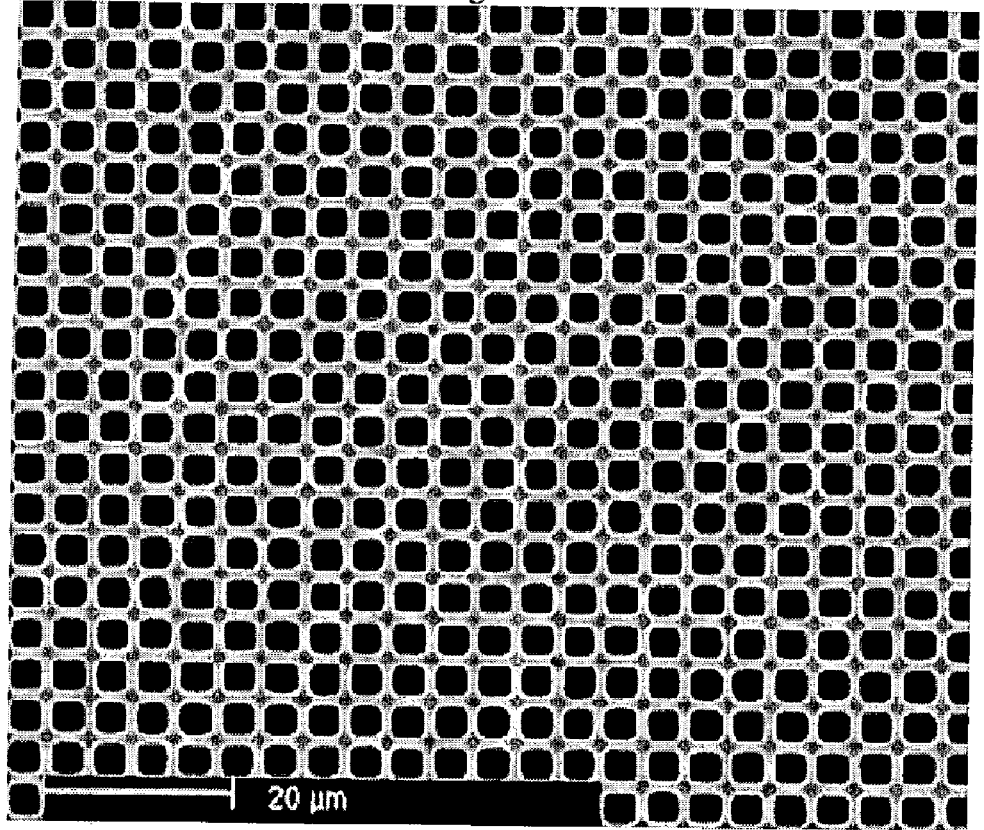
Figure 17C:
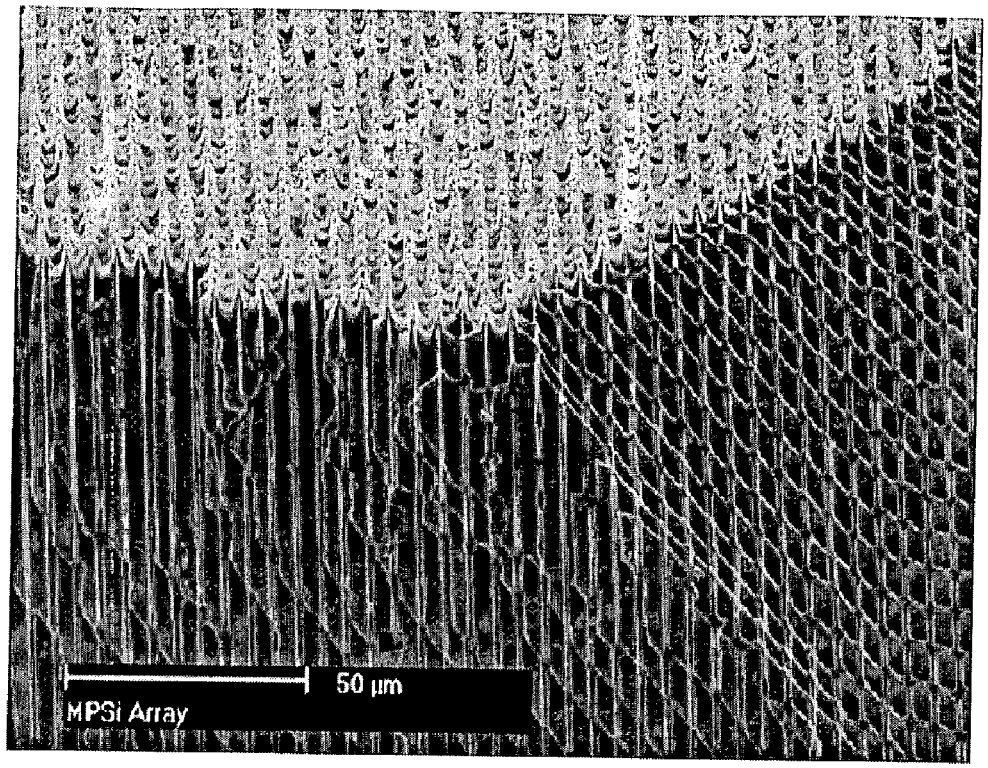
FIG. 17c is an illustrative SEM image of the MPSi layer cleaved with three planes visible.
Figure 17D:
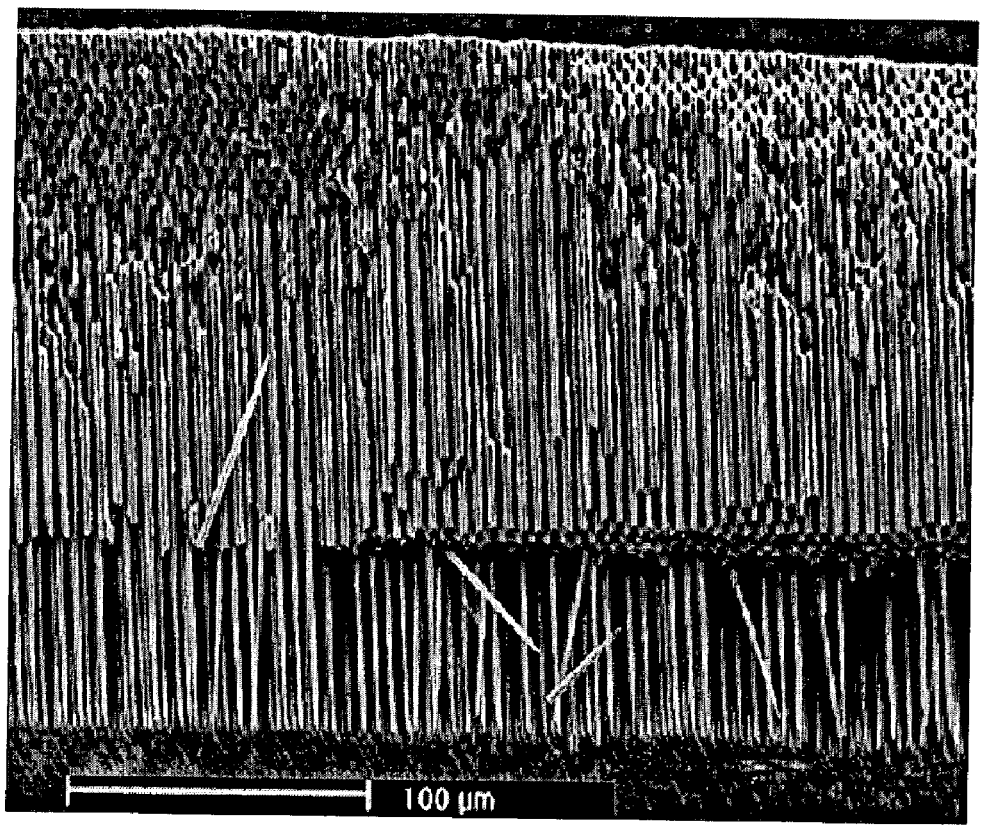
FIG. 17d is an illustrative SEM image of the freestanding MPSi layer cleaved in cross section.

In support of the cited examples, FIGS. 17a–17d show different views of different spectral filter structures fabricated according to the manufacturing methods disclosed: FIG. 17a shows an MPSi array with near-circular pores expanded to near-square tapered ends, while FIG. 17b shows an MPSi array with near-square pores and no tapered ends. FIGS. 17a–17b show SEM images of the first surface of the filter wafers having different pore shapes. FIG. 17c gives an SEM image of an MPSi layer cleaved on two planes in addition to the first surface. FIG. 17d presents an SEM image of a freestanding MPSi layer cleaved normal to the first surface. It should be noted that dielectric layers have been removed from the pore walls from all of the structures in FIGS. 17a–17d to prevent charging problem during SEM measurements.

Figure 18A:
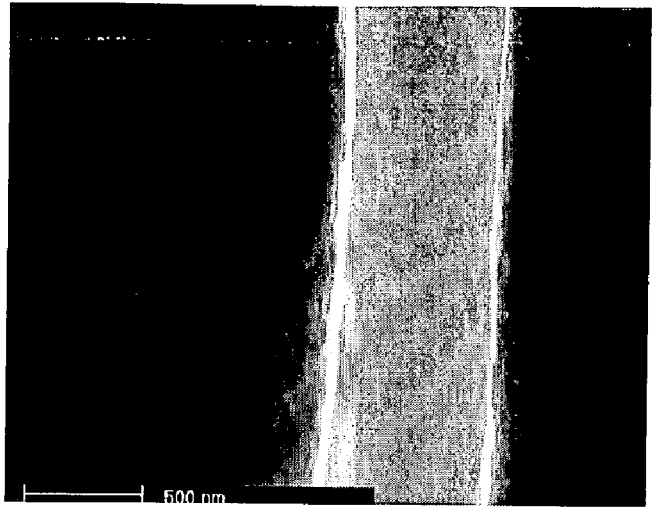
FIG. 18a is an illustrative SEM image of the pore wall right after the end of the electrochemical etching process.
Figure 18B:
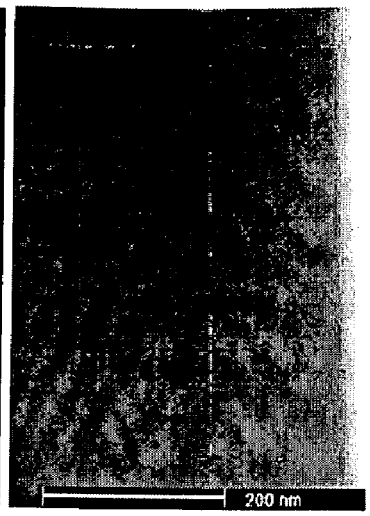
FIG. 18b is an illustrative SEM image of the pore wall after the end of pore wall smoothening process.

FIGS. 18a and 18b illustrate the method of suppressing the roughness of the pore walls. FIG. 18a shows an SEM image of a pore wall right after the end of the electrochemical etching process. A small, but clearly resolvable roughness of the pore wall is present. FIG. 18b shows an SEM image of the pore wall (with about a 3 times higher magnification than that of FIG. 18a) after the pore wall roughness suppression treatment. In this exemplarily case, said treatment was thermal oxidation of MPSi layer for 4 hours at about 1000° C. in dry oxygen atmosphere to produce about 200–300 nm of $SiO_2$ on the pore walls, followed by oxide removal in 48% aqueous HF solution. It is illustrated that the pore wall roughness was suppressed to below the SEM resolution level.

Figure 19A:
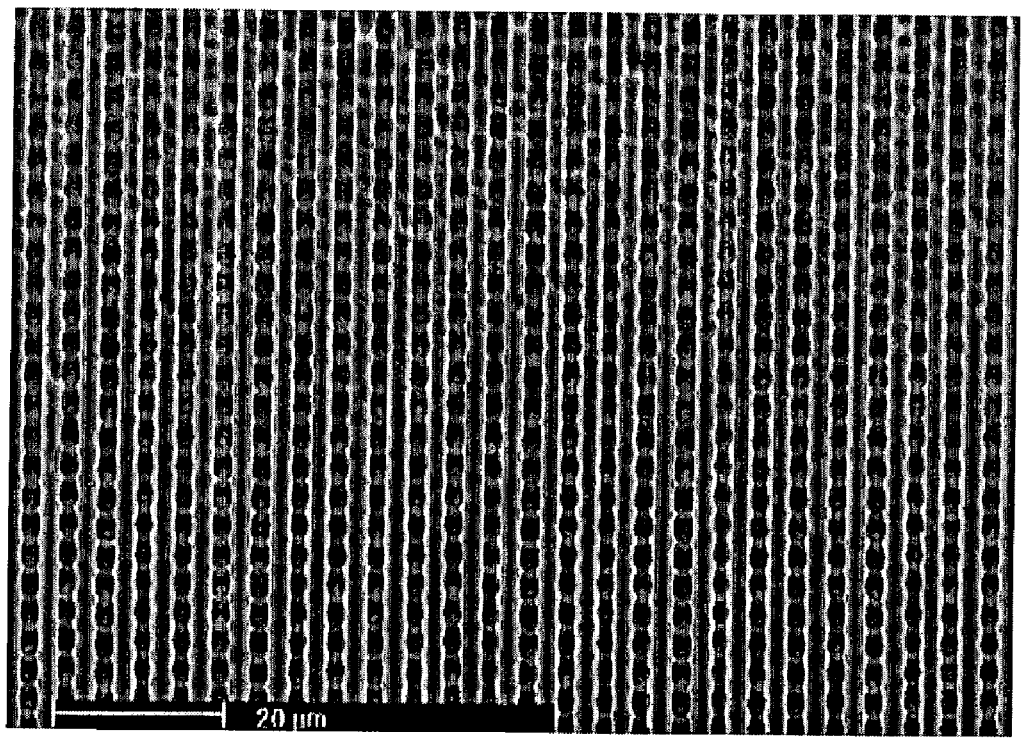
FIG. 19a is an illustrative SEM image of the freestanding MPSi layer having pore cross sections periodically modulated along their depth.
Figure 19B:
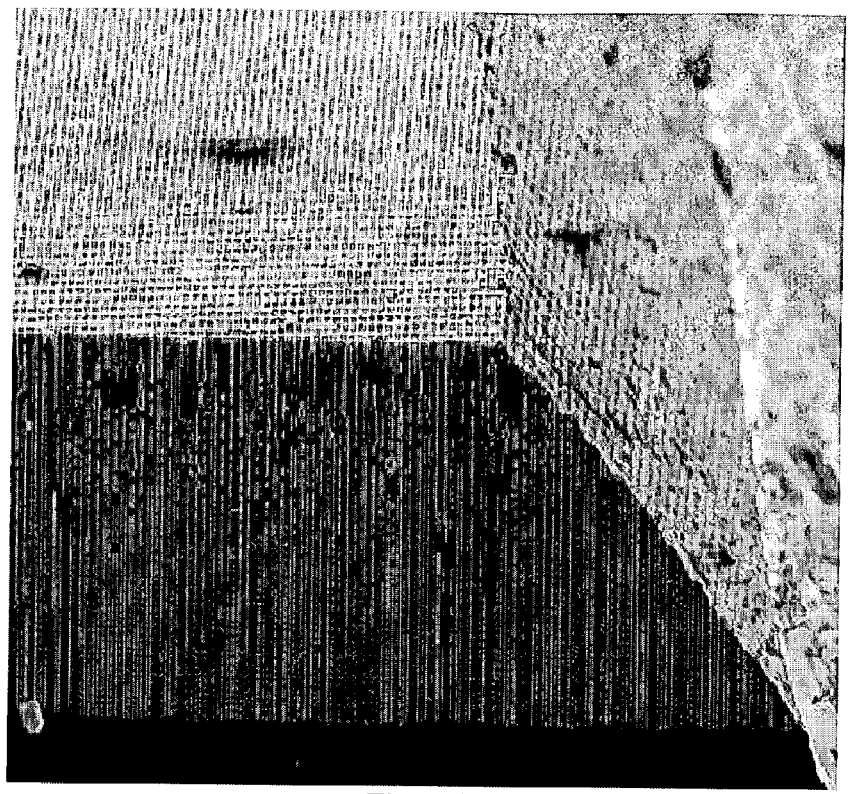
FIG. 19b is an illustrative SEM image of the freestanding MPSi layer having pore cross sections periodically modulated along their depth cleaved with three planes visible.

FIGS. 19a and 19b give SEM images of an MPSi layer having pore cross-sections periodically modulated along their depths. FIG. 19a gives an SEM image of an MPSi layer cleaved perpendicular to the first surface. FIG. 19b shows an SEM image of the same MPSi layer cleaved on two planes in addition to the first surface.

Figure 20:
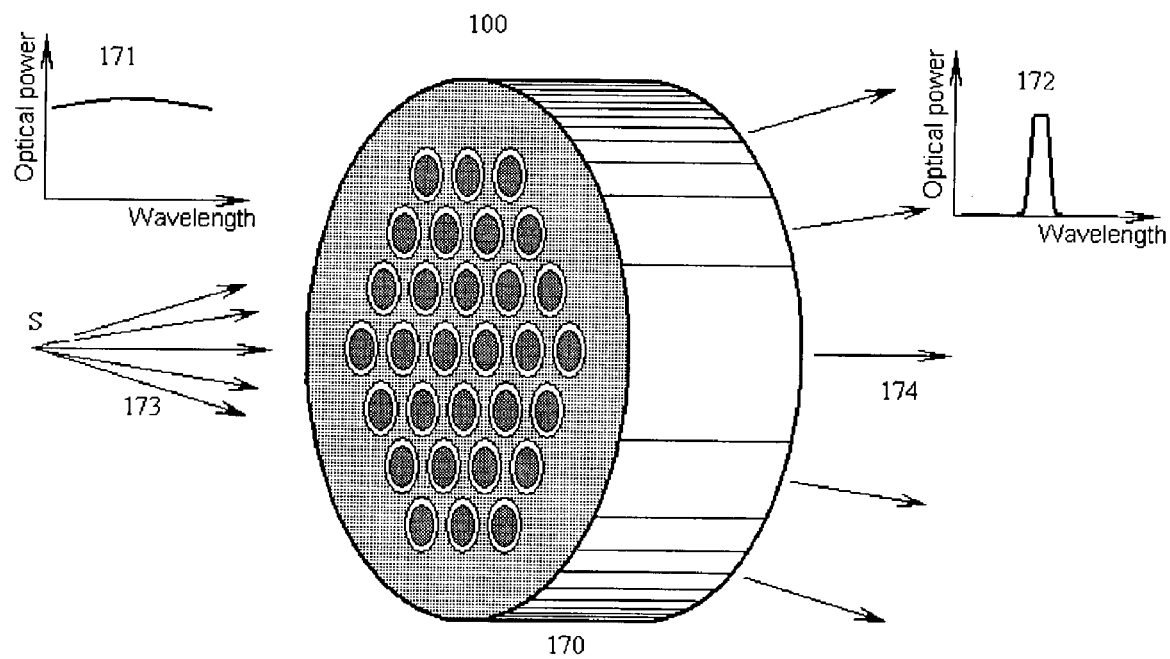
FIG. 20 is a perspective and schematic view of an exemplary illustrative optical system.

FIG. 20 shows an exemplary illustrative optical system 170 employing a spectral filter 100 of any of the embodiments shown in FIGS. 4, 7, 0, 11, 12a or 13a described above. In this example, a source of ultraviolet illumination S directs ultraviolet, near ultraviolet or other wavelength radiation 173 toward spectral filter 170. The source S in the example shown is relatively broadband in that it produces a wide range of radiation wavelengths at approximately uniform power output 171. The spectral filter 100 shown in this example embodiment applies an optical filter transfer function to the incident radiation 173 (see transfer function graph shown in the upper right-hand corner of the FIG. 172). The radiation 174 that passes through the filter 100 is thus band-limited. This radiation may be directed toward an object to be illuminated, a process requiring particular wavelengths of ultraviolet radiation, or any other desired application.

As discussed above, the preferred filters are stable, do not degrade over time when exposure to UV irradiation, and offer superior transmittance for use as bandpass filters. Such filters are useful for a wide variety of applications, including applications where current filter systems cannot provide acceptable performance.

For instance, optical filters will be especially useful for a variety of analytical devices. In particular, in many biomedical analysis systems, e.g., to detect the presence of a specific marker (e.g. enzyme) in a blood or tissue sample, the marker will be identified by fluorescence upon exposure of the sample to a detection wavelength. The emission from the sample can be accurately detected using a filter that does not autofluoresce. In contrast, prior art filters may exhibit significant autofluorescence, such as resulting from the required epoxy lamination of such filters, and said autofluorescence can render the analysis system unreliable or even practically inoperable. Other illustrative applications of the spectral filters include but not limited to spectroscopy, astronomy, staring arrays, and photolithography.

The invention is not to be limited to the disclosed embodiments, but on the contrary, is intended to cover various modifications and equivalent arrangements included within the scope of the claims.

The invention claimed is:

1. A method of making a spectral filter comprising:
   providing a substrate wafer of single-crystal semiconductor having a first surface and a second surface,
   etching the substrate wafer to provide a structured macroporous layer having pores with controlled depths defined at least partially therethrough,
   coating the pores wit at least one layer of a material substantially transparent within the pass-band of said spectral filter, said material having a thickness of at least 10 nm, and
   removing at least one un-etched portion of the substrate wafer to thereby provide a spectral filter.

2. The method of claim 1 wherein said semiconductor substrate wafer comprises a silicon wafer.

3. The method of claim 2 wherein said etching comprises electrochemical etching and includes connecting the substrate as an electrode, contacting the first surface of the substrate with an electrolyte, setting a current density which will influence etching erosion, and continuing etching to form said pores extending to a desired depth substantially perpendicular to said first surface.

4. The method of claim 3, wherein said electrochemical etching occurs in a fluoride-containing, acidic electrolyte.

5. The method of claim 4, wherein said electrolyte contains hydrofluoric acid in a range of 1% to 50% by volume.

6. The method of claim 4, wherein said electrolyte additionally contains an oxidizing agent.

7. The method of claim 4, wherein said electrolyte additionally contains a hydrogen-contributing reducing agent.

8. The method of claim 7, wherein said hydrogen reducing agent is selected from the group of chemicals consisting of mono functional alkyl alcohols, tri functional alkyl alcohols, and tri functional alkyl alcohols.

9. The method of claim 4, wherein said electrolyte additionally contains a viscosity-increasing agent.

10. The method of claim 4, wherein said electrolyte additionally contains a conductivity-modifying agent.

11. The method of claim 4, wherein said electrolyte additionally contains a wetting agent.

12. The method of claim 3, wherein electrochemical etching parameters are selected from the group consisting of electrical current density, illumination intensity and/or applied voltage are set approximately constant during the electrochemical etching process.

13. The method of claim 3, wherein at least one electrochemical etching parameter selected from the group consisting of electrical current density, illumination intensity and/or applied voltage is changing in a predetermined fashion with time during the electrochemical etching process.

14. The method of claim 2, wherein said silicon wafer is a <100>-oriented wafer, and
   wherein the electrolyte additionally contains at least one organic additive.

15. The method of claim 14, wherein the said at least one organic additive is selected from the group consisted of acetonitrile, dimethylformamide, dimethylsulfoxide, diethylenglycol, formamide, hexamethylphosphoric triamide, isopropanol, triethanolamine, 2-methoxyethyl ether, triethylphosphite, and triethyleneglycol dimethyl ether.

16. The method of claim 14 further including illuminating a second surface of the substrate wafer that lies opposite the first surface during electrochemical etching.

17. The method of claim 14, wherein electrical current density is set approximately constant during said electrochemical etching.

18. The method of claim 16, wherein at least one electrochemical etching parameter selected from the group consisting of electrical current density, illumination intensity and/or applied voltage is changing in a predetermined fashion with time during the electrochemical etching.

19. The method of claim 1 wherein said semiconductor substrate wafer is of material chosen from the full possible range of alloys and compounds of zinc, cadmium, mercury, silicon, germanium, tin, lead, aluminum, gallium, indium, bismuth, nitrogen, oxygen, phosphorus, arsenic, antimony, sulfur, selenium and tellurium, and
   wherein said etching comprises electrochemical etching and includes connecting the substrate as an electrode, contacting the first surface of the substrate with an electrolyte, setting a current density which will influence etching erosion, and continuing etching to form said pores extending to a desired depth substantially perpendicular to said first surface.

20. The method of claim 3, wherein said electrochemical etching occurs in an acidic electrolyte.

21. A method of making a spectral filter, said method comprising:
   providing a substrate wafer of single-crystal semiconductor having a first surface and a second surface,
   etching the substrate wafer to provide a macroporous structured layer having pores with controlled depths defined at least partially therethrough,
   removing at least one un-etched part of the substrate wafer, and
   coating the pores with at least one layer of a material substantially transparent within the pass-band of said spectral filter material and having a thickness of at least 10 nm to thereby provide a spectral filter,
   wherein said semiconductor substrate wafer is a silicon wafer, and
   wherein said etching comprises electrochemical etching and includes connecting the substrate as an electrode, contacting the first surface of the substrate with an electrolyte, setting a current density which will influence etching erosion, and continuing etching to form said pores extending to a desired depth substantially perpendicular to said first surface.

22. The method of claim 21, wherein said electrochemical etching occurs in a fluoride-containing acidic electrolyte.

23. The method of claim 22, wherein said electrolyte contains hydrofluoric acid in a range of 1% to 50%.

24. The method of claim 22, wherein said electrolyte additionally contains an oxidizing agent.

25. The method of claim 24, wherein said electrolyte additionally contains a hydrogen-contributing reducing agent.

26. The method of claim 25, wherein said hydrogen-contributing reducing agent is selected from the group of chemicals consisting of mono functional alkyl alcohols, tri functional alkyl alcohols and tri functional alkyl alcohols.

27. The method of claim 22, wherein said electrolyte additionally contains at least one viscosity increasing agent.

28. The method of claim 22, wherein said electrolyte additionally contains at least one conductivity modifying agent.

29. The method of claim 22, wherein said electrolyte additionally contains at least one wetting agent.

30. A method of making a spectral filter, said method comprising:
providing a substrate wafer of single-crystal semiconductor having a first surface and a second surface,
etching the substrate wafer to provide a macroporous structured layer having pores with controlled depths defined at least partially therethrough,
removing at least one un-etched part of the substrate wafer, and
coating the pores with at least one layer of a material substantially transparent within the pass-band of said spectral filter material and having a thickness of at least 10 nm to thereby provide a spectral filter,
wherein said semiconductor substrate wafer is a silicon wafer, and
wherein said silicon wafer is of <100>-orientation, and
wherein said silicon wafer comprises an n-type doped wafer.

31. The method of claim 30 further including illuminating a second surface of the substrate wafer that lies opposite the first surface during electrochemical etching.

32. The method of claim 31, wherein electrochemical etching parameters are selected from the group consisting of electrical current density, illumination intensity, temperature and/or applied voltage are set approximately constant during the electrochemical etching process.

33. The method of claim 21, wherein at least one electrochemical etching parameter selected from the group consisting of electrical current density, illumination intensity and/or applied voltage is varied in a predetermined fashion with lime during the electrochemical etching process.

34. A method of making a spectral filter, said method comprising:
providing a substrate wafer of single-crystal semiconductor having a first surface and a second surface,
etching the substrate wafer to provide a macroporous structured layer having pores with controlled depths defined at least partially therethrough,
removing at least one un-etched part of the substrate wafer, and
coating the pores with at least one layer of a material substantially transparent within the pass-band of said spectral filter material and having a thickness of at least 10 nm to thereby provide a spectral filter,
wherein said semiconductor substrate wafer is a silicon wafer, and
wherein said silicon wafer is of <100>-orientation, and
wherein said silicon wafer is a p-type doped wafer, and
wherein the electrolyte additionally contains at least one organic additive.

35. The method of claim 34, wherein the said at least one organic additive is selected from the group consisted of acetonitrile, dimethylformamide, dimethylsulfoxide, diethylenglycol, formamide, hexamethylphosphoric triamide, isopropanol, triethanolamine, 2-methoxyethyl ether, triethylphosphite, triethyleneglycol dimethyl ether.

36. The method of claim 34 further including illuminating a second surface of the substrate wafer that lies opposite the first surface during electrochemical etching.

37. The method of claim 34, wherein electrical current density is set approximately constant during electrochemical etching process.

38. The method of claim 36, wherein at least one electrochemical etching parameter selected from the group consisting of electrical current density, illumination intensity and/or applied voltage is changing at a predetermined fashion during electrochemical etching process.

39. A method of making a spectral filter, said method comprising:
providing a substrate wafer of single-crystal semiconductor having a first surface and a second surface,
etching the substrate wafer to provide a macroporous structured layer having pores with controlled depths defined at least partially therethrough,
removing at least one un-etched part of the substrate wafer, and
coating the pores with at least one layer of a material substantially transparent within the pass-band of said spectral filter material and having a thickness of at least 10 nm to thereby provide a spectral filter,
wherein said semiconductor substrate wafer is of material chosen from the full possible range of alloys and compounds of zinc, cadmium, mercury, silicon, germanium, tin, lead, aluminum, gallium, indium, bismuth, nitrogen, oxygen, phosphorus, arsenic, antimony, sulfur, selenium and tellurium, and
wherein said etching is electrochemical etching and includes connecting the substrate as an electrode, contacting the first surface of the substrate with an electrolyte, setting a current density which will influence etching erosion, and continuing etching to form said pores extending to a desired depth substantially perpendicular to said first surface.

40. The method of claim 39, wherein said electrochemical etching occurs in an acidic electrolyte.

41. The method of claim 1 further including using said spectral filter to spectrally filter light at green and shorter wavelengths.

* * * * *